United States Patent [19]
Ogino et al.

[11] Patent Number: 5,337,090
[45] Date of Patent: Aug. 9, 1994

[54] VIDEO OUTPUT CIRCUIT WITH WIDE BANDWIDTH AND LOW POWER CONSUMPTION FOR HIGH RESOLUTION DISPLAY

[75] Inventors: Masanori Ogino; Takeo Yamada; Miyuki Ikeda, all of Yokohama; Tsuneo Fujikura, Chigasaki; Takahiko Fujiwara, Yokohama, all of Japan

[73] Assignee: Hitachi, Ltd., Tokyo, Japan

[21] Appl. No.: 986,033

[22] Filed: Dec. 4, 1992

[30] Foreign Application Priority Data

Dec. 10, 1991 [JP]  Japan ................................. 3-325519

[51] Int. Cl.$^5$ .............................................. H04N 5/21
[52] U.S. Cl. ..................................... 348/626; 348/380
[58] Field of Search ................ 333/167, 170, 171, 184; 358/184, 160, 34; H04N 5/21

[56] References Cited

U.S. PATENT DOCUMENTS

| | | | |
|---|---|---|---|
| 1,624,665 | 4/1927 | Johnson et al. | 333/170 |
| 1,752,579 | 4/1930 | Shea | 333/167 |
| 1,897,639 | 2/1933 | Kreer | 333/170 |
| 2,024,014 | 1/1936 | Bode | 333/163 |
| 3,105,206 | 9/1963 | Bundy | 333/170 |
| 4,293,875 | 10/1981 | Katz | 358/184 |
| 4,528,520 | 7/1985 | Osawa . | |

Primary Examiner—Victor R. Kostak
Assistant Examiner—Nathan J. Flynn
Attorney, Agent, or Firm—Fay, Sharpe, Beall, Fagan, Minnich & McKee

[57] ABSTRACT

A video output circuit of a wide bandwidth comprises a bridged-T-type circuit, a first inductor connected in series to the bridged-T-type circuit, and a shunt circuit connected in series to the bridged-T-type circuit and including a second inductor and a first resistor connected in parallel with each other. The bridged-T-type circuit, the first inductor and the shunt circuit cooperate to constitute together with a plurality of stray capacitors a low-pass filter whose order is at least 4 and whose merit index is at least 3.

9 Claims, 15 Drawing Sheets $C = R/2\pi fc$ $$\begin{cases} C_2 = 3C_1 = \dfrac{1.5R}{2\pi fc} \\ L = 1.33 \times 2\pi fcR \end{cases}$$

Loss ≒ 2.3W

VIDEO OUTPUT CIRCUIT WITH WIDE BANDWIDTH AND LOW POWER CONSUMPTION FOR HIGH RESOLUTION DISPLAY

BACKGROUND OF THE INVENTION

The present invention relates generally to a video output circuit of a wide bandwidth designed for a CRT (Cathode Ray Tube) display device or the like.

For the video output circuit developed in these years for practical applications to CRT displays of super high resolution, there is required as high an output power as 100 $V_{pp}$ with a frequency on the order of 100 MHz.

In such video output circuit, a video output terminal thereof is inevitably accompanied with a stray capacitor of a finite value. As a consequence, power consumption of the video output circuit increases in proportion to a frequency bandwidth and a voltage amplitude as required. As an attempt for suppressing the power consumption from increasing, there have heretofore been proposed a variety of high-frequency peaking circuits, typical ones of which are shown in FIGS. 2A, 2B and 2C of the accompanying drawings, respectively. More specifically, FIG. 2A shows a shunt circuit of a capacitor (C) and a resistor (R) including no peaking circuit. In this figure, reference numeral 1 denotes a current source for supplying a current of magnitude I, numeral 2 denotes a resistor having a resistance value R, and numeral 3 denotes a capacitor having a value of C. The output voltage of this shunt circuit is indicated by a symbol E. Representing a 3dB bandwidth by $f_c$, there exists among the parameters C, R and $f_c$ a relation given by an expression inserted in FIG. 2A.

FIG. 2B shows a peaking circuit whose order is equal to 3 (a peaking circuit of second order, to say in another way), in which reference numerals 4 and 5 denotes capacitors having values $C_1$ and $C_2$, respectively, and 6 denotes an inductor having a value L. In order to realize a so-called Butterworth maximally-flat frequency characteristic in this circuit, the parameters $C_1$, L, $C_2$, R and $f_c$ are so selected as to satisfy the condition given by the expression inserted in FIG. 2B.

Finally, FIG. 2C shows a bridged-T-type peaking circuit, details of which is disclosed in U.S. Pat. No. 4,528,520 entitled "WIDE BAND HIGH OUTPUT AMPLIFIER USING A POWER FIELD EFFECT TRANSISTOR AS AN OUTPUT STAGE". In the figure, reference numeral 7 denotes an output capacitor of a value $C_0$, and numerals 9 and 10 denote stray capacitors of values $C_{s1}$ and $C_{s2}$, respectively.

When a transfer impedance of each of the circuit shown in FIGS. 2A and 2B is represented by T($=E/I$), frequency characteristics of these circuits can be determined in accordance with the expressions (1), (3) and (5) mentioned below. In this conjunction, it is considered to be convenient and reasonable to define a merit index (M) of a peaking circuit in terms of a product of an overall capacitor value, a load resistor value, the 3 dB bandwidth and $2\pi$.

In accordance with the above definition, the merit index M of the circuit shown in FIG. 2A is "1" (one) in accordance with the expression (2) mentioned below.

On the other hand, the merit index M of the peaking circuit shown in FIG. 2B is equal to "2", as determined in accordance with the expression (4) also mentioned below.

In the case of the peaking circuit shown in FIG. 2C, the merit index M is equal to $2\sqrt{2}$ on the assumption that the stray capacitors $C_{s1}$ and $C_{s2}$ are absent, as can be seen from the undermentioned expression (6).

$$|T/R| = \{1+(f/f_c)^2\}^{-0.5} \quad (1)$$

$$M = 2\pi f_c CR = 1 \quad (2)$$

$$|T/R| = \{1+(f/f_c)^6\}^{-0.5} \quad (3)$$

$$M = 2\pi f_c (C_1+C_2)R = 2 \quad (4)$$

$$|T/R| = \{1+(f/f_c)^4\}^{-0.5} \quad (5)$$

$$M \equiv 2\pi f_c C_0 R = 2\sqrt{2} \quad (6)$$

As is apparent from the above, the prior art circuits shown in FIGS. 2A to 2C suffer limitation that the merit index M can not exceed three.

SUMMARY OF THE INVENTION

In the light of the state of the art described above, it is therefore an object of the present invention to provide a peaking circuit which has the merit value of more than three inclusive and which can thus enjoy a high efficiency (i.e., high output power over a wide frequency bandwidth with a relatively low power consumption).

Another object of the present invention is to implement a video output circuit for a CRT display unit or the like which can enjoy an improved efficiency.

Yet another object of the present invention is to provide a video output circuit which is advantageously suited for driving differentially a first grid and a cathode of a cathode ray tube or CRT.

It is a further object of the present invention to provide a compensator circuit suited profitably for use as a preceding circuit for a high-efficiency video output circuit.

It is still another object of the present invention to provide a high-efficiency video output circuit which requires no load resistor.

It is yet another object of the present invention to stabilize input/output bias voltages in a high-efficiency video output circuit.

In view of the above and other objects which will become more apparent as description proceeds, there is provided according to an aspect of the present invention a video output circuit of a wide bandwidth which comprises a bridged-T-type circuit, a first inductor connected in series to the bridged-T-type circuit, and a shunt circuit connected in series to the bridged-T-type circuit and including second inductor and a first resistor connected in parallel with each other. The bridged-T-type circuit, the first inductor and the shunt circuit constitute together with a plurality of stray capacitors a low-pass filter whose order is equal to or more than 4, wherein the low-pass filter has a merit index of a value equal to or more than 3.

With the structure of the video output circuit described above, the merit index of more than 3 inclusive can be realized with the efficiency being improved correspondingly.

In a preferred mode for carrying out the invention, the bridged-T-type circuit may include a first capacitor, a coil connected in parallel to the first capacitor and having a center tap, and a third inductor connected to the center tap of the coil. The shunt circuit may further include a second resistor connected in series to the parallel connection of the second inductor and the first resistor. Further, one of the plural stray capacitors may be present equivalently at an end of the third inductor which end is not connected to the center tap, while another one of the plural stray capacitors may be present equivalently at an end of the first inductor which end is not connected to the bridged-T-type circuit and-/or at an end of the second resistor which end is connected to the second inductor.

In a preferred embodiment of the wide bandwidth video output circuit described above, it may further comprise a preceding frequency characteristic compensation circuit, which is constituted by a cascode amplification circuit provided at the input side of the low-pass filter, a cable interfacing circuit provided at the input side of the cascode amplification circuit. The cable interfacing circuit includes a cable, a first voltage follower provided at the input side of the cable, a first voltage follower provided at the input side of the cable, a second voltage follower provided at the output side of the cable, wherein a product of a one-way delay time of the cable and an overall 3 dB frequency bandwidth is so set as to lie within a range from 0.125 to 0.5 inclusive.

With the above-mentioned configuration of the video output circuit, the cable interfacing circuit is driven by a low-impedance source at the input side while the output side is terminated with a high-impedance load. Thus, the cable interfacing circuit can exhibit a high-frequency peaking effect.

The wide bandwidth video output circuit described above may further comprise a complementary-type current-source differential push-pull output circuit for driving differentially a first grid electrode of a cathode ray tube or CRT and a cathode electrode thereof.

According to another aspect of the present invention, there is provided a video output circuit of a wide bandwidth which comprises a cascode output circuit, a complementary voltage follower circuit, a first circuit connected between the cascode output circuit and the complementary voltage follower circuit. The first circuit includes a bridged-T-type circuit, a first inductor connected in series to the bridged-T-type circuit, a shunt circuit connected in series to the bridged-T-type circuit and including second inductor and first resistor connected in parallel with each other. The bridged-T-type circuit, the first inductor and the shunt circuit cooperate with a plurality of stray capacitors to constitute a low-pass filter whose order is equal to or more than 4 (i.e., a low-pass filter of fourth or greater order).

With the structure of the video output circuit described just above, the merit index greater than 3 inclusive can be realized, whereby the efficiency can correspondingly be improved. Besides, in this video output circuit, a low-loss implementation thereof can be achieved owing to a current amplification effect afforded by the complementary voltage follower circuit, which in turn contributes to a further improvement of the efficiency of the video output circuit.

According to still another aspect of the present invention, there is provided a video output circuit for a CRT display which comprises a complementary-type current-source differential push-pull output circuit for driving differentially a first grid electrode of the CRT and a cathode electrode thereof.

The above-mentioned video output circuit for the CRT display may further comprise a preceding frequency characteristic compensation circuit which includes cascode amplification circuit provided at the input side of the low-pass filter and a cable interfacing circuit provided at the input side of the cascode amplification circuit. The cable interfacing circuit in turn includes a cable, a first voltage follower provided at the input side of the cable, a second voltage follower provided at the output side of the cable. A product of a one-way delay time of the cable and an overall 3 dB frequency bandwidth is so selected as to lie within a range from 0.125 to 0.5 inclusive thereof.

With the structure described just above, the cable interfacing circuit is driven by a low-impedance source at the input side while the output side is terminated by a high-impedance load. Thus, the cable interfacing circuit can exhibit a high-frequency peaking effect.

The video output circuit for the CRT may further comprise an input blanking signal potential stabilizing circuit. The input blanking signal potential stabilizing circuit includes a detector unit for detecting an input blanking signal potential, and a control unit for controlling an input bias voltage for a differential pair. With this structure, variations in the blanking potential can automatically be compensated for, whereby the input bias voltage can be stabilized.

The video output circuit for the CRT display described just above may further comprise an output blanking signal potential stabilizing circuit which in turn includes a detector unit for detecting an output blanking signal potential and a control unit for controlling an output bias voltage. With this structure, variations in the blanking potential can automatically be compensated for, whereby the input bias voltage can be stabilized.

According to a still further aspect of the present invention, there is provided a video output circuit which comprises a complementary-type current-source push-pull output circuit, and a voltage negative-feedback resistor, whereby a frequency characteristic of a video output signal can be flattened without using in effect any video output load resistor. In this structure of the video output circuit, the complementary current-source push-pull output circuit operates to supply currents of both positive and negative polarities to the stray capacitors. Consequently, the output load resistor is rendered unnecessary. Besides, the voltage negative-feedback resistor mentioned above serves to flatten the frequency characteristic of the output voltage.

The video output circuit may further comprise an idle current stabilizing circuit which in turn includes a detector unit for detecting an idle current of the complementary-type current-source push-pull output circuit and a control unit for controlling the idle current.

According to a still further aspect of the present invention, there is provided a video output circuit which comprises a complementary current push-pull output circuit, a voltage negative-feedback resistor, a phase leading compensating capacitor connected in parallel to the voltage negative-feedback resistor, and a current follower provided at the input side of the video output circuit. The output of the current follower is coupled to the complementary current push-pull output circuit through the voltage negative-feedback resistor and the phase leading compensating capacitor.

DESCRIPTION OF THE PREFERRED EMBODIMENTS

Now, the present invention will be described in detail in conjunction with preferred or exemplary embodiments thereof by reference to the accompanying drawings.

Figure 1:
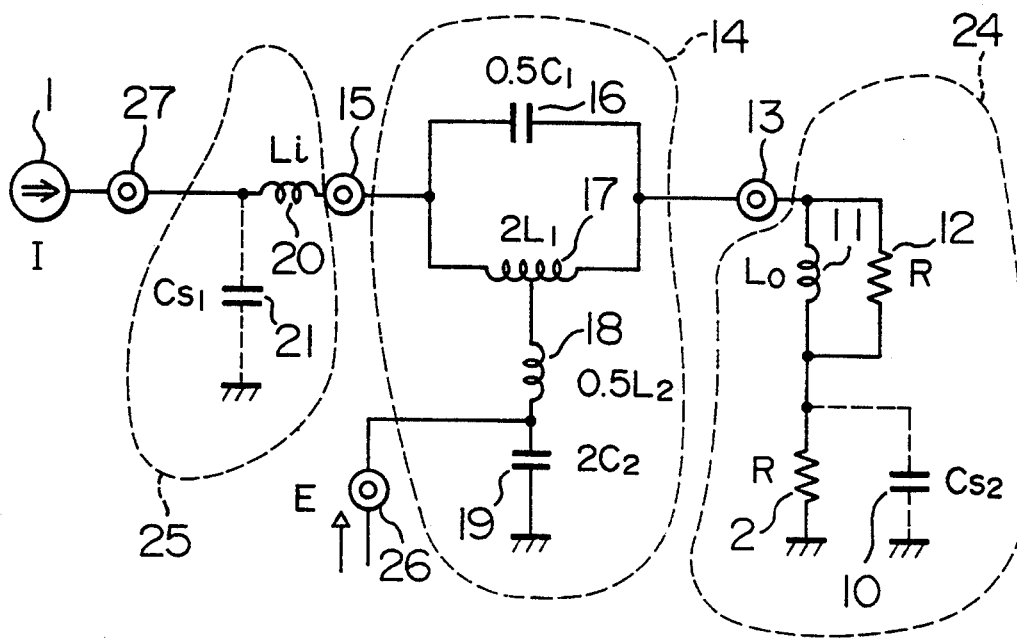
FIG. 1 is a schematic circuit diagram showing a configuration of a wide-bandwidth video output circuit according to a first embodiment of the present invention.

FIG. 1 shows a video output circuit of a wide bandwidth according to a first embodiment of the invention. It should however be mentioned that FIG. 1 shows the same in the form of an equivalent high-frequency circuit in which bias voltage sources and others are omitted from illustration.

Referring to FIG. 1, a reference numeral 1 denotes generally a current source capable of supplying a current of a magnitude or value I, numeral 2 denotes a load resistor having a resistance value R, numeral 10 denotes a stray capacitor having a value of $C_{s2}$ and coupled in parallel to the load resistor 2, numeral 11 denotes an inductor having a value $L_0$, and a numeral 12 denotes a resistor of a value R, numerals 13, 15, 26 and 27 denote nodes or terminals inserted only for the purpose of convenience of the description, numeral 14 generally denotes a bridged-T-type circuit block, which includes a capacitor 16 having a value 0.5 $C_1$, a transformer coil 17 having an inductance value of $2L_1$, an inductor 18 having a value of 0.5 $L_2$, a capacitor (stray capacitor) 19 coupled across an input electrode terminal of a CRT display unit (not shown) and having a value of $2C_2$. Further, reference numeral 20 denotes an inductor having a value of $L_i$ and a numeral 21 denotes a stray capacitor coupled to the node 27 and having a value of $C_{s1}$. A broken-line block 24 generally designates a constant-resistor circuit, while a broken-line block 25 generally designates a peaking circuit provided at the input side.

At first, description will be directed to the principle underlying the video output circuit shown in FIG. 1. As can be seen, the inductor 18 is connected to a center tap of the transformer 17. In the following description, it is assumed that the windings of the transformer 17 are in the closely coupled condition.

First, the constant-resistor circuit block 24 will be considered.

The value $L_0$ of the inductor 11 is so selected that a relation given by the expression (7) mentioned below applies valid to and among the stray capacitor 10 ($C_{s2}$), the inductor 11 ($L_0$) and the resistor 12 (R). In that case, the constant-resistant circuit block 24 exhibits an impedance which is essentially equal to the resistance value R of the resistor 12 independent of the frequency, as can be seen from the undermentioned expression (8).

$$R^2 = \frac{L_0}{C_{S2}} \tag{7}$$

$$\frac{1}{\frac{1}{R} + \frac{1}{PL_0}} + \frac{1}{\frac{1}{R} + PC_{S2}} = R \tag{8}$$

In the above expression (8), a symbol P represents a complex angular frequency given by $j\omega$.

Next, consideration will turn to the bridged-T-type circuit block 14. The values $L_1$, $C_1$, $L_2$ and $C_2$ of the circuit elements 17, 16, 18 and 19 are so selected that a relation given by the following expression (9) can apply valid.

$$\left\{ \begin{array}{l} L_1 C_1 = L_2 C_2 \equiv \tau_0^2 = \dfrac{1}{\omega_0^2} \\[6pt] \dfrac{1}{R^2} \equiv G^2 = \dfrac{C_1}{L_2} = \dfrac{C_2}{L_1} = \sqrt{\dfrac{C_1 C_2}{L_1 L_2}} \end{array} \right. \tag{9}$$

where $\omega_0$ represents a resonant angular frequency, $\tau_0$ represents a reciprocal thereof and G represents a reciprocal of R.

When an in-phase admittance Y+ and a differential admittance Y- of a combination circuit of the bridged-T-type circuit block 14 and the constant-resistor circuit block 24 as viewed from the nodes 15 and 13, respectively, are to be determined, they can be given by a set of expressions (10) mentioned below. Further, an admittance matrix ($Y_{ij}$) thereof is given by the expression (11). Accordingly, an input impedance $Z_1$ as viewed to the right from the node 15 in FIG. 1 can be determined in accordance with the expression (12) also mentioned below.

$$Y^+ = \frac{1}{PL_2 + \frac{1}{PC_2}} = \frac{1}{(P^2 + \omega_0^2)\frac{L_2}{P}}$$

$$Y^- = \frac{1}{PC_1 + \frac{1}{PL_1}} = \frac{1}{(P^2 + \omega_0^2)\frac{C_1}{P}}$$

$$Y^+ \cdot y^- = G^2, P \equiv j\omega \equiv j2\pi f$$

(10)

$$2(y_{ij}) = \begin{bmatrix} Y^+ + Y^-, & Y^+ - Y^- \\ Y^+ - Y^-, & Y^+ + Y^- + 2G \end{bmatrix}$$

(11)

$$Z_1 = \frac{y_{22}}{|y_{ij}|} \underset{(11)}{=} \frac{Y^+ + Y^- + 2G}{G(Y^+ + Y^-) + 2Y^+ \cdot Y^-} \underset{(10)}{=} R$$

(12)

In conjunction with the expressions stated in the specification, it is to be mentioned that the expression identification number inserted below an equality sign (see, for example, the above expression (12)) indicates the ground or base expression which can justify the use of the relevant equality sign. As can now be seen from the expression (12), the impedance as viewed to the right from the node 15 in FIG. 1 is nothing but a constant resistance having a value R.

Now, let's determine a transfer admittance $T_0$ of the circuit block 14 in the direction from the node 15 to the node 13 in FIG. 1. This transfer admittance can be given by the following expression (13):

$$T_0 = \frac{-y_{21}}{|y_{ij}|} \underset{(11)}{=} \frac{Y^- - Y^+}{G(Y^+ + Y^- + 2G)}$$

$$\underset{(10)}{=} R\frac{(Y^-)^2 - G^2}{G^2 + (Y^-)^2 + 2GY^-} = \frac{Y^- - G}{Y^- + G}R$$

$$\underset{(10)}{=} \frac{1 - \frac{\tau_0}{C_1R}\tau_0 P + (\tau_0 P)^2}{1 + \frac{\tau_0}{C_1R}\tau_0 P + (\tau_0 P)^2} R$$

$$\therefore \left|\frac{T_0}{R}\right| = 1$$

(13)

On the other hand, a transfer impedance $T'$ of the circuit block 14 as viewed in the direction from the node 15 to the node 26 (an input electrode of the CRT) can be determined in accordance with the following expression (14):

$$T' \underset{(9)}{=} \frac{Z_1 + T_0}{2} \cdot \frac{1}{1 + (\tau_0 P)^2}$$

$$\underset{(12),(13)}{=} \frac{R}{1 + 2\zeta_2\tau_0 P + (\tau_0 P)^2}$$

$$2\zeta_2 = \frac{\tau_0}{C_1R} \underset{(9)}{=} \frac{L_1}{\tau_0 R} \underset{(9)}{=} \frac{C_2R}{\tau_0}$$

$$= \sqrt{\frac{C_2}{C_1}}$$

(14)

where $\zeta_2$ represents a damping coefficient. As can be seen from the expression (14), the transfer admittance $T'$ represents the characteristic of a low-pass filter whose order is equal to 2 (i.e., low-pass filter of second order).

Now, having described the bridged-T-type circuit block 14 and the constant-resistor circuit block 24, let's consider the peaking circuit block 25 provided at the input side of the video output circuit. The values $L_1$ and $C_{s1}$ of the circuit elements 20 and 21 are so selected that a relation given by the following expression (15) can apply valid.

$$C_{S1}L_i = \tau_0^2 \equiv \frac{1}{\omega_0^2}$$

(15)

A current transfer ratio ($I_{15}/I$) from the node 27 to the node 15 can be determined as follows:

$$\frac{I_{15}}{I} \underset{(12)}{=} \frac{1}{1 + (R + PL_i)PC_{S1}}$$

$$\underset{(15)}{=} \frac{1}{1 + 2\zeta_1\tau_0 P + (\tau_0 P)^2}$$

$$2\zeta_1 = \frac{C_{S1}R}{\tau_0}$$

(16)

Accordingly, an overall transfer impednace T(E/I) in the video output circuit shown in FIG. 1 is given by the following expression (17):

$$\frac{T}{R} = \frac{E}{IR} = \frac{T}{R} \cdot \frac{I_{15}}{I}$$

$$\underset{(14),(16)}{=} \frac{1}{1 + 2\zeta_2\tau_0 P + (\tau_0 P)^2} \cdot \frac{1}{1 + 2\zeta_1\tau_0 P + (\tau_0 P)^2}$$

$$= \frac{1}{1 + 2j\zeta_2 f/f_0 - (f/f_0)^2} \cdot \frac{1}{1 + 2j\zeta_1 f/f_0 - (f/f_0)^2}$$

$$\because \tau_0 P = j\omega\tau_0 = j\frac{\omega}{\omega_0} = \frac{f}{f_0}$$

(17)

As can be seen from the form of the expression (17), the overall transfer impedance is in reciprocal proportion to the fourth power of the frequency f in the region where the frequency f is sufficiently higher than $f_0$. To say in another way width, the wide-band video output circuit according to the first embodiment shown in FIG. 1 exhibits a low-pass filter characteristic of fourth order (i.e., the characteristic of the low-pass filter whose order is equal to 4).

As can be seen from the expression (17), the values of the damping coefficients $\xi_1$ and $\xi_2$ characterize the shape or profile of the frequency characteristic of the video output circuit. The ratio between the damping coefficients $\xi_1$ and $\xi_2$ is equal to the ratio between $C_{s1}$ and $C_2$, as can be seen from the expressions (16) and (14).

It may reasonably be considered that the frequency characteristic can be determined by allocation of the roots of the frequency f obtained by equating to zero the denominators of the expression (17).

Figure 3A:
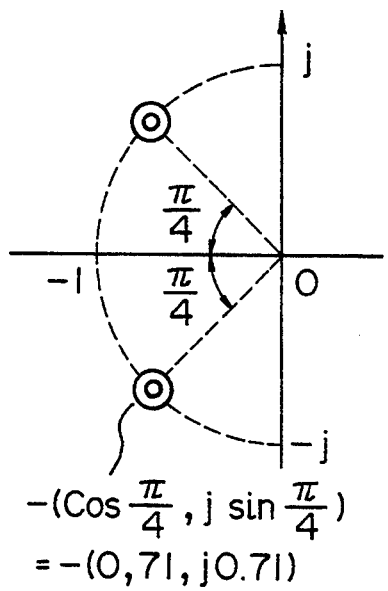
FIGS. 3A, 3B, 3C and 3D are roots allocation diagrams for illustrating the principles underlying various embodiments of the invention, respectively.
Figure 3B:
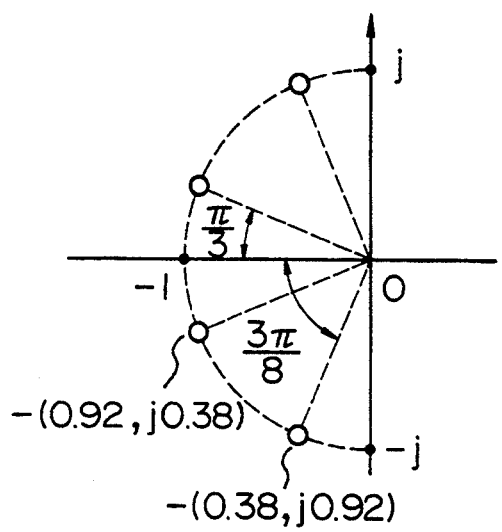

Examples of the root allocation which can ensure the frequency characteristic of flat amplitude are illustrated in FIGS. 3A and 3B. In FIG. 3A, double-circles indicate double roots.

Merit indexes of the first embodiment are shown in the table 1. More specifically, there are shown in the column (d) of the table 1 the values of $\xi_2/\xi_1$, $|R^2/T^2|$, $C_2$, $C_{s1}$ and the merit indexes M, M' which correspond to the root allocation illustrated in FIG. 3A. The values shown in columns (e) and (f) correspond the root allocation shown in FIG. 3B. Both the examples shown in the columns (e) and (f) of the table 1 are identical in respect to the overall root allocation.

As can be seen from the table 1, the values of the merit indexes are not smaller than three. Thus, it is safe to say that the object of the present invention mentioned hereinbefore can be achieved.

Figure 2A:
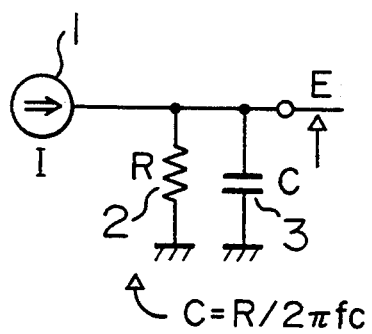
FIGS. 2A, 2B and 2C are schematic circuit diagrams showing typical video output circuits known heretofore, respectively.
Figure 2B:
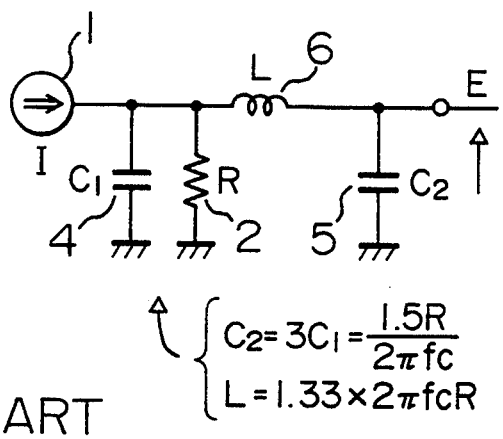
Figure 2C:
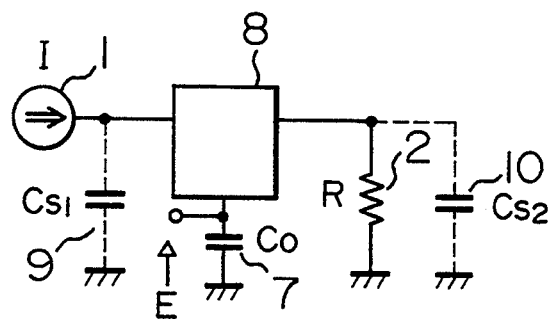

Parenthetically, the column (a) of the table 1 corresponds to the circuit configuration described hereinbefore by reference to FIG. 2A.

TABLE 1

|  | (a) | (d) | (e) | (f) |
|---|---|---|---|---|
| order | 1 | 4 | 4 | 4 |
| $\zeta_2/\zeta_1$ | — | 0.71/0.71 | 0.92/0.38 | 0.38/0.92 |
| $\left\|\dfrac{R^2}{T^2}\right\|$ | $1+\left(\dfrac{f}{f_c}\right)^2$ | $\left\{1+\left(\dfrac{0.8f}{f_c}\right)^4\right\}^2$ | $1+\left(\dfrac{f}{f_c}\right)^8$ | $1+\left(\dfrac{f}{f_c}\right)^8$ |
|  | Exp. (1) | ...Exp. (20) | ...Exp. (21) | ...Exp. (22) |
| $\dfrac{2C_2}{C}$ *1 | — | 2.26 | 3.68 | 1.52 |
| $\dfrac{C_{S1}}{C}$ *1 | — | 1.13 | 0.76 | 1.84 |
| $M_{(C_{S2}=0)}$ *2 | 1 | 3.39 | 4.44 | 3.36 |
| $M_{(C_{S2}=C_{S1})}$ *2 | 1 | 4.52 | 5.20 | 5.20 |
| Note | — | $f_c = 0.8f_0$, $\{1+(0.8)^4\}^{1/2} \approx 2$ ...Exp. (23) | $f_c = f_0$ | $f_c = f_0$ |

*1 $C = 1/2\pi f_c R$,
*2 $M = 2\pi f_c (2C_2 + C_{S1} + C_{S2})R$

Figure 3C:
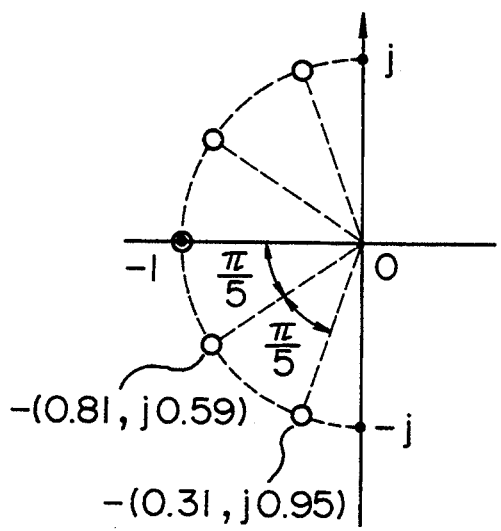
Figure 3D:
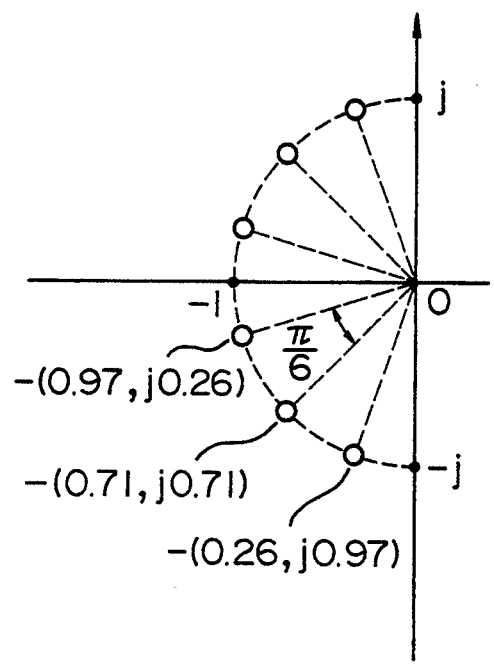
Figure 4:
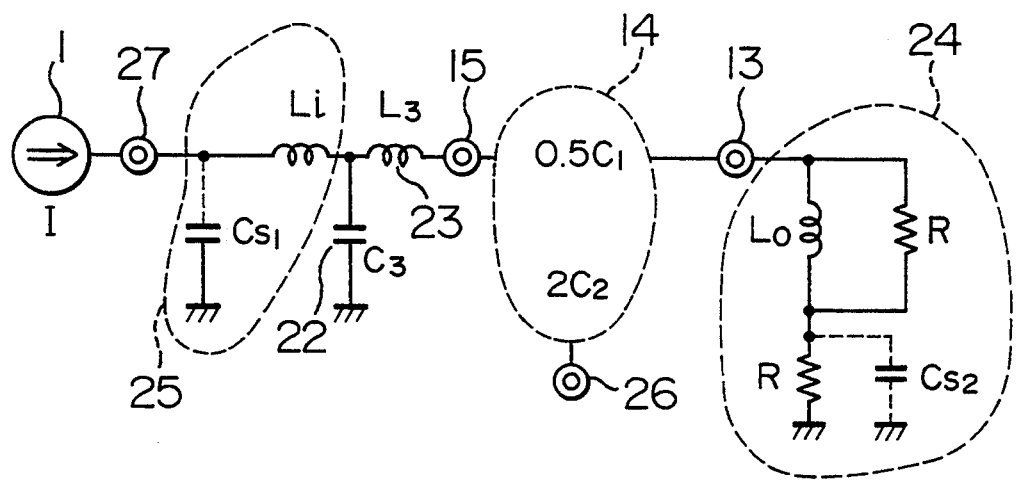
FIG. 4 is a circuit diagram showing a video output circuit according to a second embodiment of the invention.

FIG. 4 shows a wide-bandwidth video output circuit according to a second embodiment of the present invention. In the figure, reference numeral 22 denotes a capacitor having a value of $C_3$ and 23 denotes an inductor having a value of $L_3$. Other circuit elements are same as or equivalent to those shown in FIG. 1 and denoted by using like reference numerals. In contrast to the first embodiment (shown in FIG. 1) which is based on the filter configuration of fourth order, the second embodiment is concerned with a filter whose order is equal to or more than five (i.e., a low-pass filter of fifth order). Root allocations for obtaining an amplitude-flat or maximally flat frequency characteristic in the video output circuit according to the second embodiment of the invention are illustrated in FIGS. 3C and 3D, wherein the root allocation shown in FIG. 3C corresponds to the filter of fifth order while the root allocation shown in FIG. 3D corresponds to the filter of sixth order.

In general, the root allocation for realizing the flat amplitude or maximally flat frequency characteristic lies on a circle having the center coinciding with the origin. In the case of the flat amplitude or maximally flat frequency characteristic of a filter of n-th order, an angle intervening between the adjacent roots is given by $\pi/n$.

The merit indexes M of video output circuit according to the second embodiment of the invention are listed in the table 2 at columns (g) and (h). The values shown at the column (a) of the table 2 are those of the filter circuit shown in FIG. 1A.

TABLE 2

|  | (a) | (g) | (h) |
|---|---|---|---|
| order | 1 | 5 | 6 |
| $\zeta_2/\zeta_1(\zeta_0)$ | — | 0.81/0.31 | 0.71/0.97(0.26) |

TABLE 2-continued

|  | (a) | (g) | (h) |
|---|---|---|---|
| $\left\|\dfrac{R^2}{T^2}\right\|$ | $1+\left(\dfrac{f}{f_c}\right)^2$ | $1+\left(\dfrac{f}{f_c}\right)^{10}$ | $1+\left(\dfrac{f}{f_c}\right)^{12}$ |
|  | ...Exp. (1) | ...Exp. (23) | ...Exp. (24) |
| $\dfrac{2C_2}{C}$ *1 | — | 3.24 | 2.84 |
| $\dfrac{C_{S1}}{C}$ *1 | — | 1.0 | 1.23 |
| $M_{(C_{S2}=0)}$ *2 | 1 | 4.24 | 4.07 |
| $M_{(C_{S2}=C_{S1})}$ *2 | 1 | 5.24 | 5.30 |

*1 $C = 1/2\pi f_c R$
*2 $M = 2\pi f_c (2C_1 + C_{S1} + C_{S2})R$

In the description made above in conjunction with the first and second embodiments of the invention, it has been assumed that the absolute values of the roots are equal to one another. However, this is only for the purpose of illustration and never stipulates any necessary condition.

Examples of standardized numerical values of the elements constituting the video output circuits according to the first and second embodiments, respectively, are shown in the following table 3. Applications to other cases where $f_c$ and R assume other various values may readily occur to those skilled in the art in accordance with the law of proportionality by consulting the table 3.

TABLE 3

| Numerical value examples in the case where $f_c = 159$ MHz and R = 1 KΩ | | | | | | |
|---|---|---|---|---|---|---|
|  | (a) | (d) | (e) | (f) | (g) | (h) |
| $2C_2$ (pF) | — | 2.26 | 3.68 | 1.52 | 3.24 | 2.84 |
| $C_{S1}$ (pF) | — | 1.13 | 0.76 | 1.84 | 1.00 | 1.23 |
| $C_{S2}$ (pF) | — | 1.13 | 0.76 | 1.84 | 1.00 | 1.23 |
| M | 1 | 4.52 | 5.20 | 5.20 | 5.24 | 5.30 |
| $0.5C_1$ | — | 0.28 | 0.27 | 0.66 | 0.31 | 0.36 |
| $C_3$ | — | — | — | — | 0.62 | 1.23 |
| $0.5L_2$ (μH) | — | 0.28 | 0.27 | 0.66 | 0.31 | 0.36 |
| $L_1$ (μH) | — | 0.57 | 0.32 | 0.54 | 1.62 | 1.63 |
| $L_0$ (μH) | — | 1.13 | 0.76 | 1.84 | 1.00 | 1.23 |
| $2L_1$ (μH) | — | 2.26 | 3.68 | 1.52 | 3.24 | 2.84 |

TABLE 3-continued

| | Numerical value examples in the case where $f_c$ = 159 MHz and R = 1 KΩ | | | | | |
|---|---|---|---|---|---|---|
| | (a) | (d) | (e) | (f) | (g) | (h) |
| $L_3$ (μH) | — | — | — | — | 0 | 0.41 |

Figure 5:
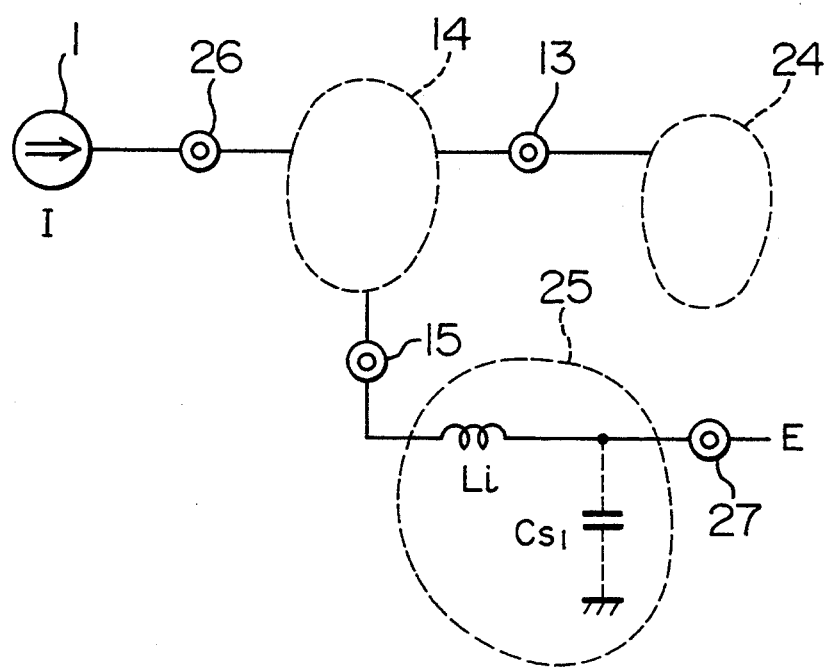
FIG. 5 is a circuit diagram showing a video output circuit according to a third embodiment of the invention.

Having described the first and the second embodiments of the invention, description will now be directed to a third embodiment of the invention by reference to FIG. 5. The instant embodiment differs from the first embodiment in that the locations of the nodes 26 and 27 shown in FIG. 1 are exchanged by each other. In the light of the reciprocity principle which applies valid in general to the passive circuit networks, it may duly be considered that the transfer impedance from the node 26 to the node 27 in the circuit shown in FIG. 5 can be given by the expression (7) mentioned previously.

Figure 6:
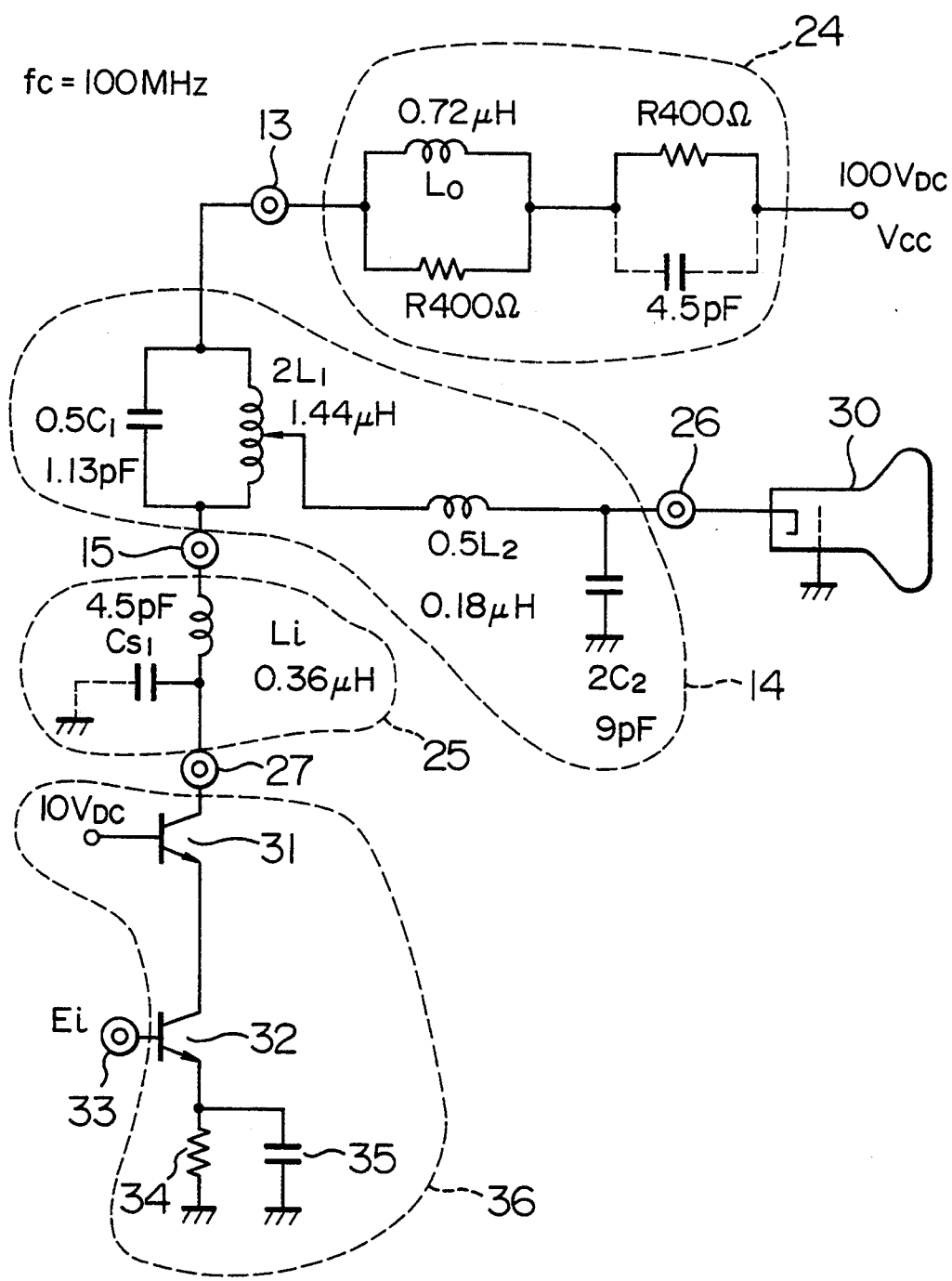
FIG. 6 is a circuit diagram showing a concrete example of implementation of the video output circuit according to the first embodiment of the invention.

The configuration according to the third embodiment can profitably be adopted in the application where the stray capacitor of the current source 1 is greater than that of the input electrode of the CRT display unit. Except for this respect, any further description of the third embodiment will be unnecessary, FIG. 6 is a circuit diagram showing a concrete circuit arrangement of the wide-bandwidth video output circuit according to the first embodiment of the present invention.

In this figure, reference numeral 30 denotes a CRT display unit, 31 denotes a grounded-base transistor, 32 denotes a grounded-emitter transistor, 33 denotes an input terminal, 34 denotes an emitter resistor, and numeral 35 denotes an emitter peaking capacitor. In the circuit shown in FIG. 6, it is assumed, by way of example, that the 3dB bandwidth $f_c$ is 100 MHz. Further, the circuit components shown in FIG. 6 have respective values indicated in the figure.

Figure 7:
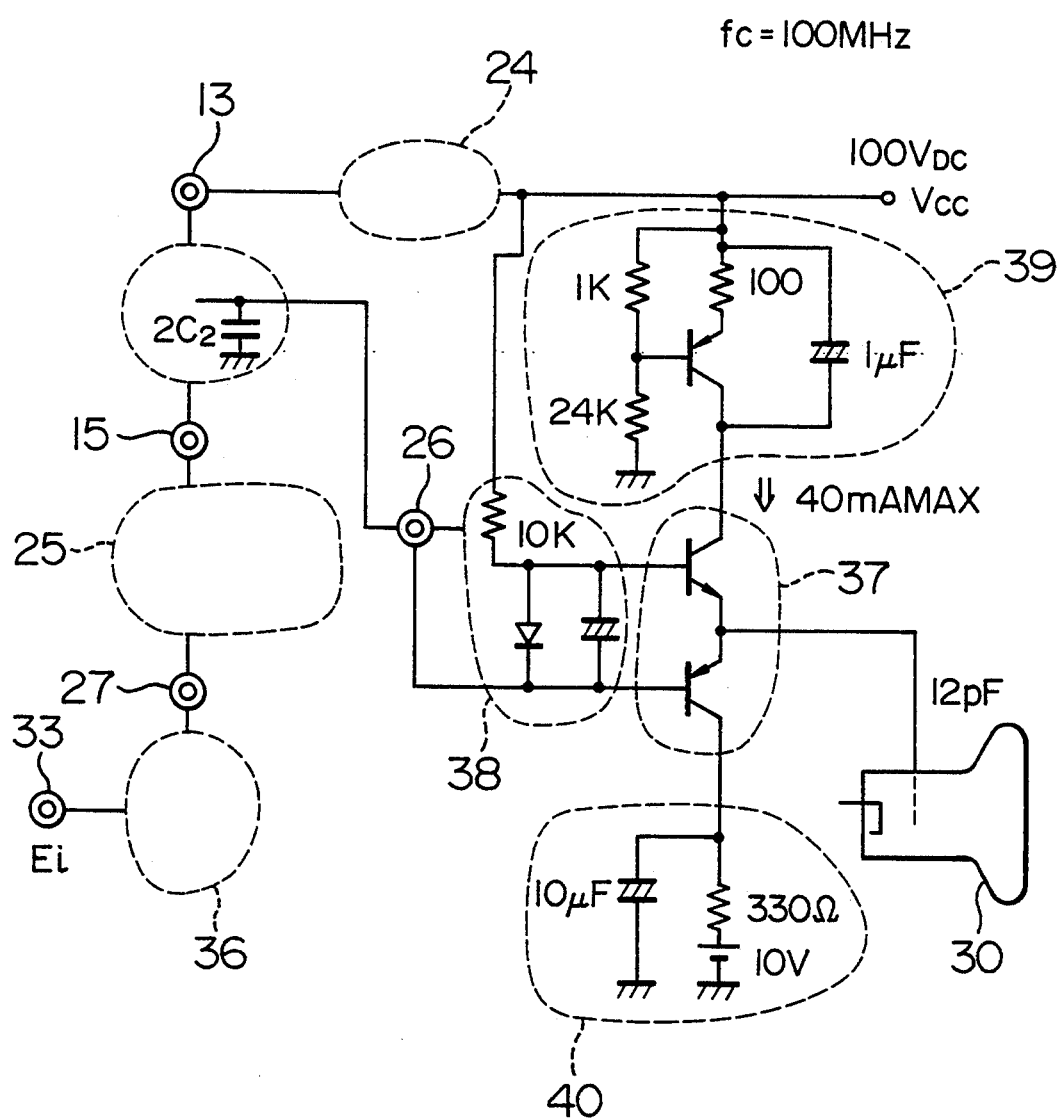
FIG. 7 is a circuit diagram showing a video output circuit according to a fourth embodiment of the invention.

FIG. 7 is a circuit diagram showing a circuit configuration of the video output circuit according to a fourth embodiment of the present invention. The circuit shown in FIG. 7 differs from the one shown in FIG. 6 in that a single-ended push-pull (SEPP) circuit is connected to the output of the filter implemented according to the first embodiment. In FIG. 7, reference numeral 38 denotes a bias supply circuit, 37 denotes a complementary voltage follower circuit, 39 denotes a current source circuit and numeral 40 denotes a protection circuit for avoiding an excessive current flow. The circuit configuration according to the fourth embodiment shown in FIG. 4 can profitably be adopted in the case where the stray capacitor of the CRT input electrode is of a large value, because the current required for charging and discharging of the stray capacitor can be supplied from the complementary voltage follower circuit 37. It should be mentioned that the current source circuit 39 may be spared. Same holds true for the excessive current protection circuit 40. In these cases, sharing of a current return path of the complementary voltage follower circuit 37 by the base-bias voltage source for the grounded-base transistor 31 shown in FIG. 6 is effective for reducing the heat loss in the complementary voltage follower circuit 37.

Figure 8:
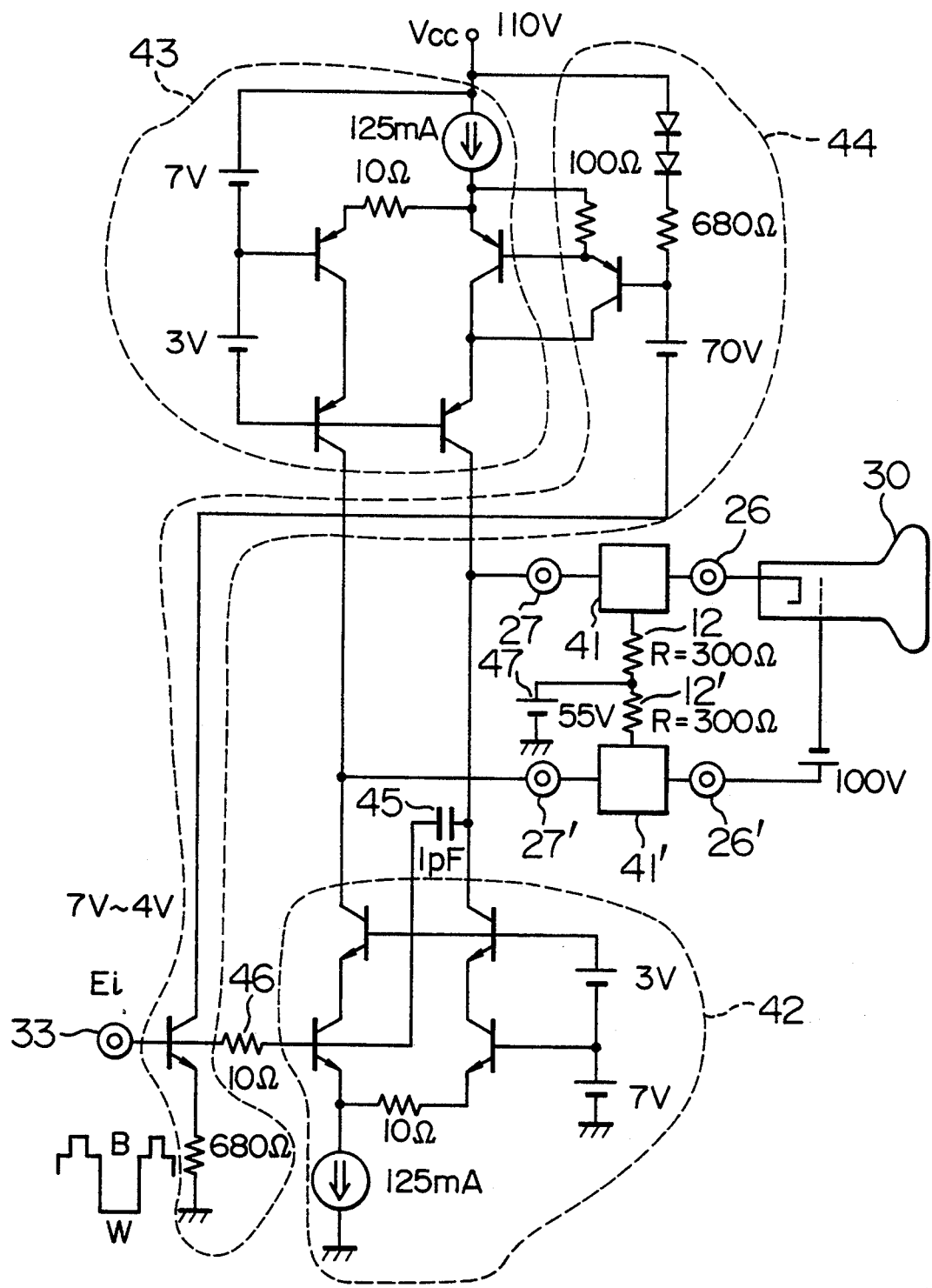
FIG. 8 is a circuit diagram showing a video output circuit according to a fifth embodiment of the invention.

A video output circuit according to a fifth embodiment of the present invention is shown in FIG. 8, which is advantageously suited for driving differentially a first grid and a cathode of a CRT display device. The circuit according to the instant embodiment may be referred to as the complementary-current-source type differential drive push-pull circuit.

Referring to FIG. 8, reference numerals 41 and 41' denote the filter circuit according to the first or second embodiment (refer to FIG. 1 or FIG. 4). Further, reference numerals 42 and 43 denote differential output circuits, respectively, which are connected in cascode, configuration (that is cascaded triode configuration) 44 denotes an inverter circuit, 45 denotes a capacitor and 46 denotes a resistor. In general, the stray capacitor of the first grid of a CRT display device is greater than that of the cathode electrode thereof. Consequently, the frequency characteristic will become non-symmetric. In this conjunction, the capacitor 45 and the resistor 46 cooperate to constitute a compensator circuit for reducing the Miller effect. By virtue of this Miller effect reducing compensator circuit, the frequency characteristic at the side of the first grid can be protected against degradation, whereby restoration of the symmetry in the frequency characteristic can be achieved. A reference numeral 47 denotes a voltage source.

An advantage of the video output circuit according to be fifth embodiment shown in FIG. 8 can be seen in a significant reduction of the power consumption.

More specifically, in the case of the circuit shown in FIG. 6, a maximum power consumption is about 20 W, as is apparent from the following expression (25).

$$\frac{80 \text{ V}}{400 \Omega} \times 100 \text{ V} = 20 \text{ W} \quad (25)$$

On the other hand, the signal voltage output as obtained is about 75 $V_{pp}$. In contrast, in the case of the video output circuit according to the fifth embodiment shown in FIG. 8, the power consumption is as low as about 13.8 W, as given by undermentioned the expression (26), while as high a signal voltage output as about 150 $V_{pp}$ (=600Ω×125 mA) can be obtained. In other words, for a same signal voltage output, the power consumption can be reduced by a factor of about 0.17 (=13.8 W/20 W×0.25) according to the fifth embodiment of the invention.

$$1125 \ mA \times 110 V = 13.8 \ W \quad (26)$$

In conjunction with the fifth embodiment shown in FIG. 8, it should further be mentioned that the nodes 27 and 26 (or 27' and 26') can be replaced by each other. As a version of this embodiment, a bypass capacitor may be inserted in place of the voltage source 47 and a negative feedback path may be provided so that the potential of the bypass capacitor is reduced about a half of $V_{cc}$ (110 V). In that case, the voltage source 47 may be spared.

Figure 16:
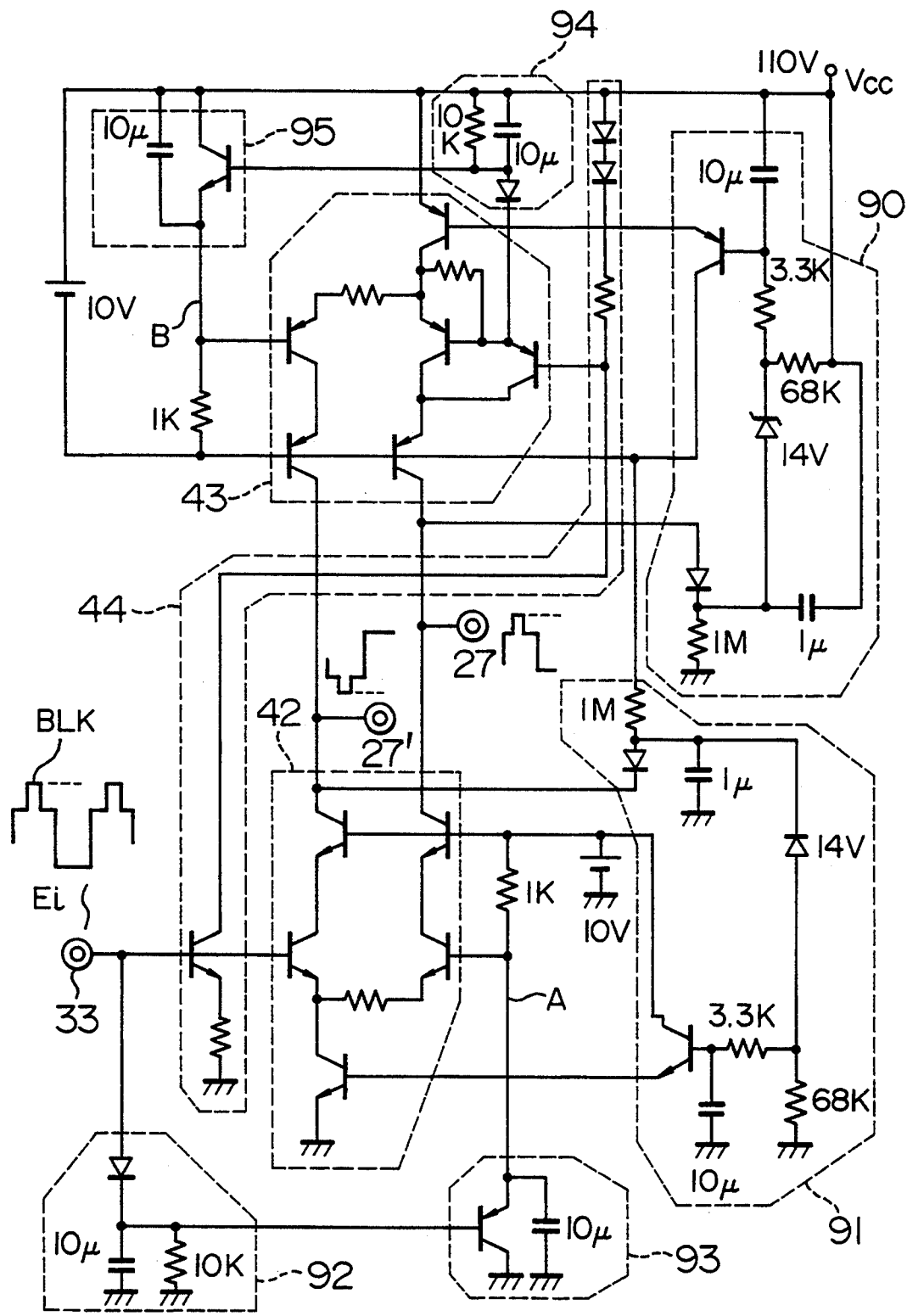
FIG. 16 is a circuit diagram showing a video output circuit according to a ninth embodiment of the invention.

Another example of the circuit configuration which permits the voltage source 47 to be spared is shown in FIG. 16, description of which will be made later on. Finally, it should further be mentioned in conjunction with the circuit according to the fifth embodiment that the voltage follower 37 mentioned above by reference to FIG. 7 may additionally be connected to the nodes 26 and 26'.

Figure 9:
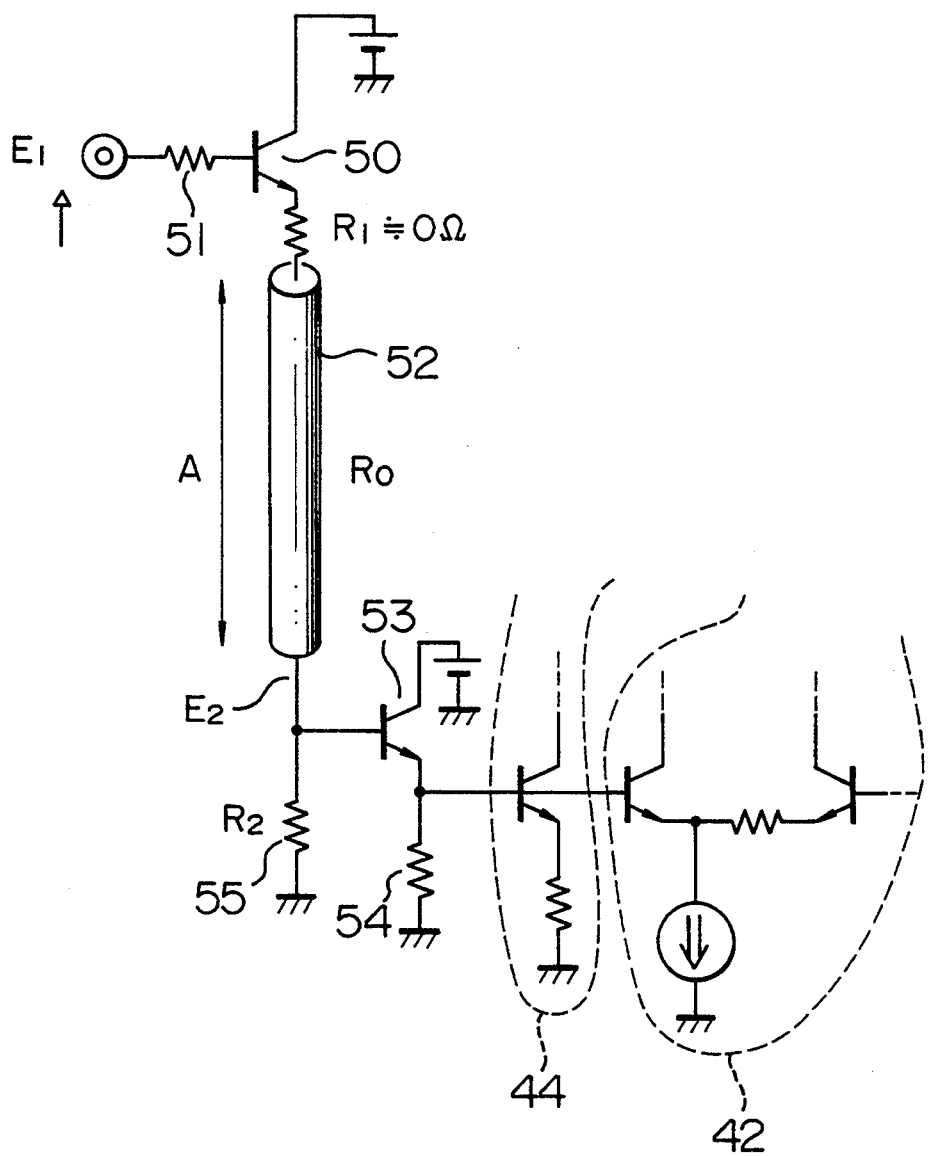
FIG. 9 is a circuit diagram showing a video output circuit according to a sixth embodiment of the invention.

FIG. 9 shows as a sixth embodiment of the invention a cable interfacing circuit which is based upon a mismatched cable principle and, which is suited for use in combination with the video output circuit described in the foregoing, being connected in precedence to the latter.

Referring to FIG. 9, reference numeral 50 denotes a voltage follower, 51 denotes an input resistor, 52 denotes a cable having a length A, 53 denotes another voltage follower, 54 denotes an emitter resistor, and 55 denotes an emitter resistor of the voltage follower 50. Further, reference numerals 42 and 44 denote schematically the corresponding circuits shown in FIG. 8.

The ratio between an input voltage $E_1$ and an output voltage $E_2$ shown in FIG. 9 can be determined in accordance with the following expression (27):

$$\left.\begin{array}{l}\dfrac{E_2}{E_1} = \dfrac{e^{-j\omega\tau}}{1 - l_{(j\omega)}} \cdot \dfrac{R_0}{R_1 + R_0} \cdot \dfrac{2R_2}{R_0 + R_2} \\[6pt] l_{(j\omega)} = e^{-2j\omega\tau} \cdot \dfrac{R_1 - R_0}{R_1 + R_0} \cdot \dfrac{R_2 - R_0}{R_2 + R_0} \\[6pt] \tau\text{(one-way cable travel time)} \approx A \times \dfrac{5\text{ ns}}{1\text{ m}}\end{array}\right\} \quad (27)$$

where a symbol $R_1$ represents a signal source resistance for the cable, $R_0$ represents a characteristic resistance intrinsic to the cable and a symbol $R_2$ represents a load resistance of the cable.

Figure 10:
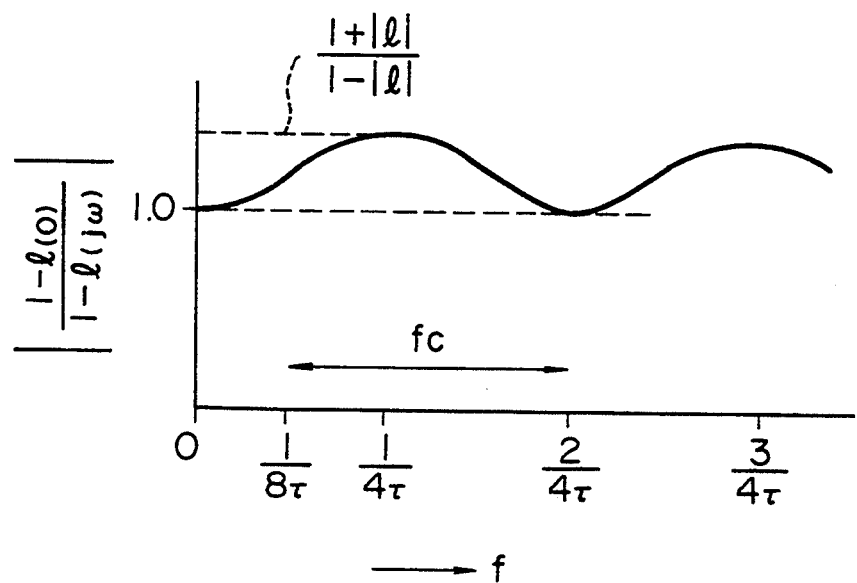
FIG. 10 is a diagram showing a frequency characteristic of the circuit shown in FIG. 9.

FIG. 10 shows a frequency characteristic of the circuit shown in FIG. 9 on the assumption that $R_1 < R_0 < R_2$.

Requirement imposed on the instant embodiment resides in that the condition of $R_1 < R_0 < R_2$ is satisfied and that a product of an overall 3 dB bandwidth and a one-way delay time $\tau$ of the cable satisfies the condition of $0.15 < f_c\tau < 0.5$, as indicated also in FIG. 10. In the cable interfacing circuit according to the sixth embodiment shown in FIG. 9, the cable 52 need not necessarily be of a coaxial type but may be of a parallel-feeder type. Of course, the cable may be a conductor pattern formed on a printed circuit board.

Figure 11:
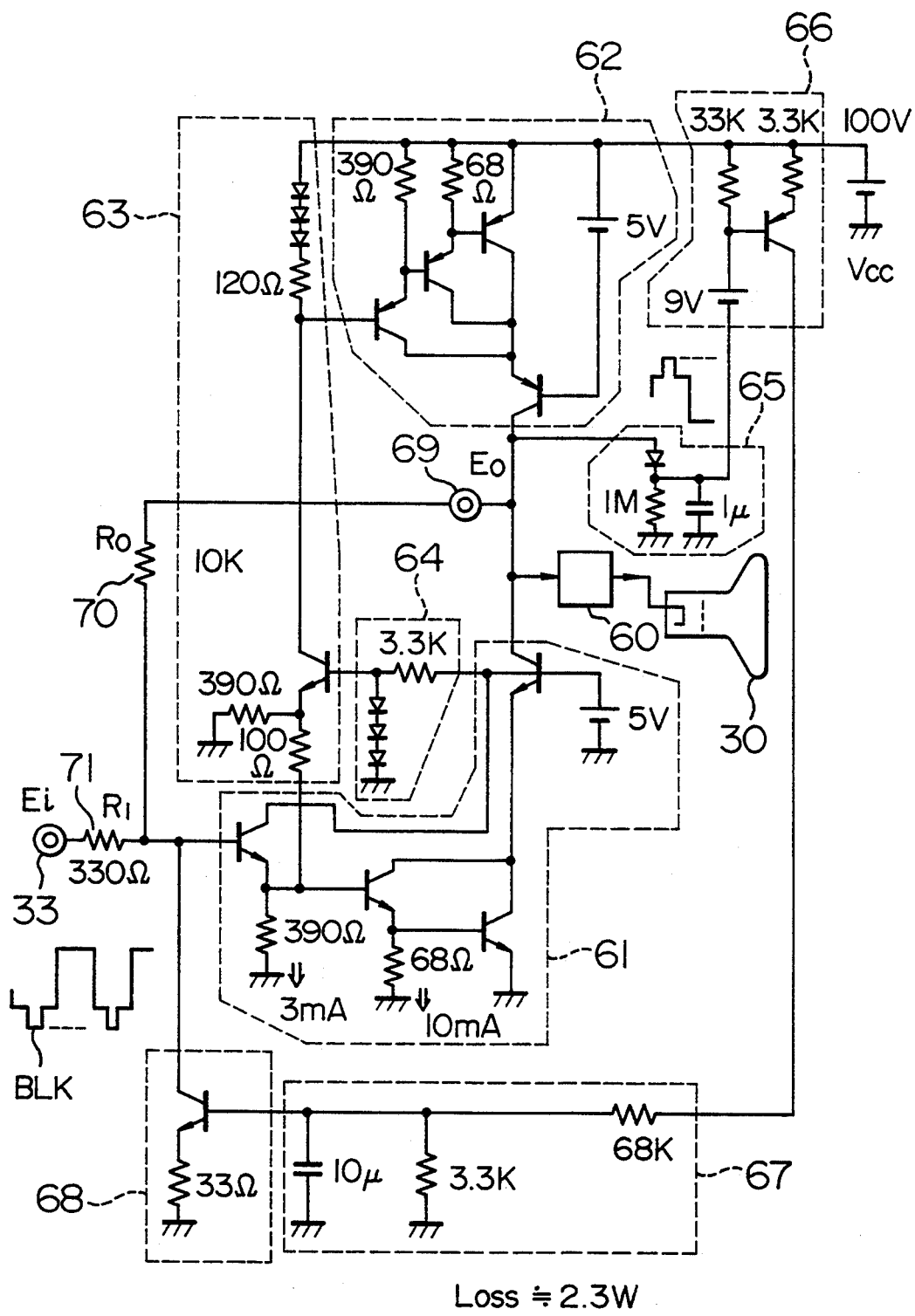
FIG. 11 is a circuit diagram showing a video output circuit according to a seventh embodiment of the invention.

FIG. 11 is a circuit diagram showing a seventh embodiment of the present invention. With this embodiment, it is intended to reduce the power consumption by omitting the output resistor from the video output circuit.

Figure 13:
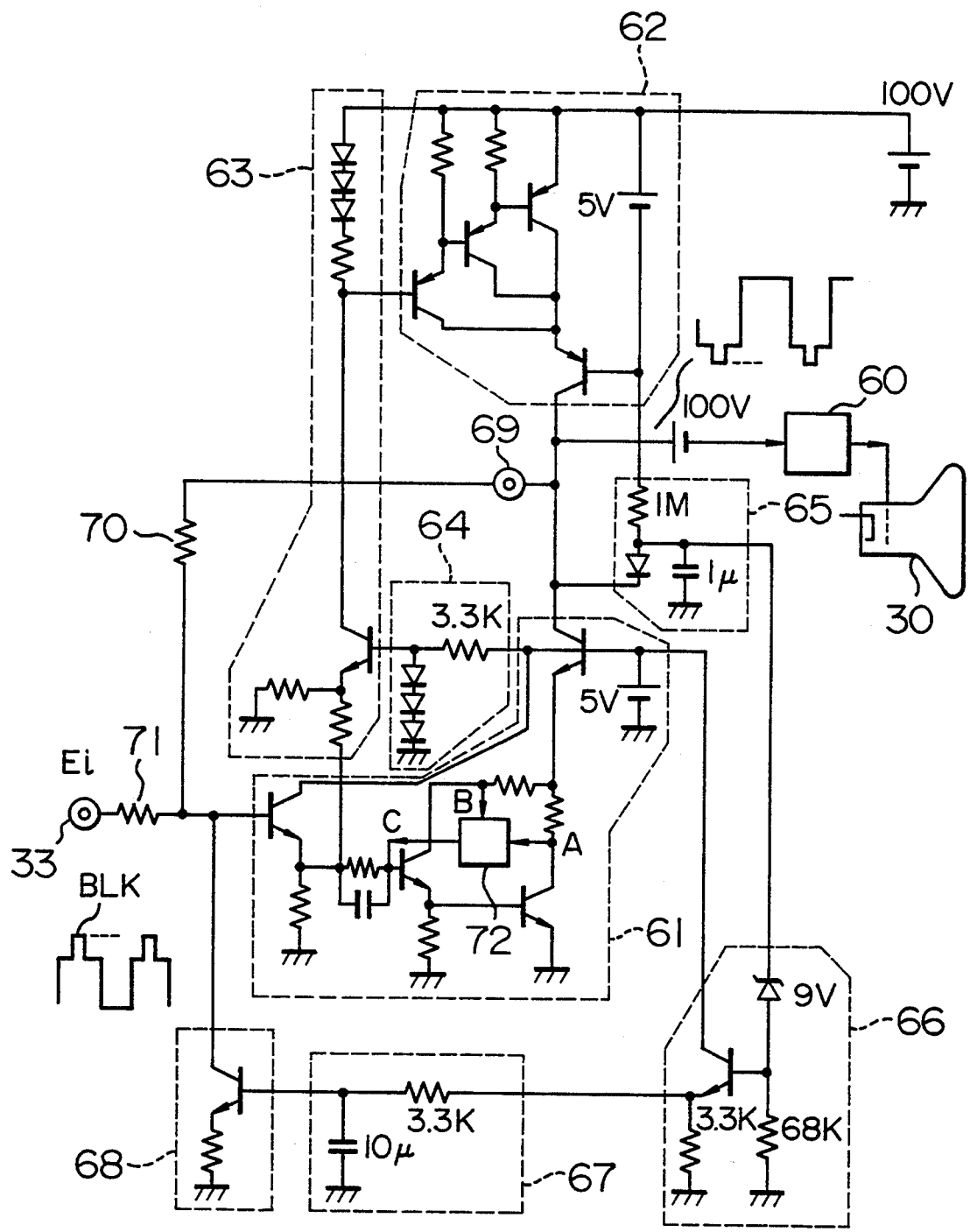
FIG. 13 is a circuit diagram showing a video output circuit according to an eighth embodiment of the invention.

In FIG. 11, a reference numeral 60 denotes a filter circuit, details of which will be described hereinafter by reference to FIG. 13. Reference numerals 61 and 62 denote cascode amplifier circuits, respectively, which constitute in combination a complementary-type current-source push-pull output circuit. Reference numeral 63 denotes a base-grounded level shift circuit and 64 denotes a base-bias/temperature compensating circuit. Further, numeral 65 denotes a peak detector circuit for detecting a blanking voltage, 66 denotes a level shift circuit, 67 denotes a low-pass filter circuit, 68 denotes a current source circuit, 69 denotes a push-pull output terminal, 70 denotes a negative voltage feedback resistor for negatively feeding back the output voltage, the resistor 70 having a value of $R_0$, and numeral 71 denotes a signal source resistor having a value of $R_1$. Finally, reference numeral 30 denotes a CRT display device and a numeral 33 denotes an input terminal.

Operation of the circuit shown in FIG. 11 will be described below.

During a half-cycle of a rise-up period of an input signal $E_i$ applied to the input terminal 33, the cascode amplifier circuit 61 is turned on while the cascode amplifier circuit 61 is turned off. On the other hand, during a half-cycle of a falling period of the input signal $E_i$, the cascode amplifier circuit 61 is turned off with the cascode amplifier circuit 62 being turned on. Thus, there is obtained at the terminal 69 an output signal having the polarity inverted. The peak detector circuit 65, the level shift circuit 66, the low-pass filter 67 and the current-source circuit 68 are provided for the purpose of stabilizing the effective bias voltage. In other words, these circuits 65 to 68 cooperate to hold the blanking output potential at value of about 90 V which is lowered from the source voltage of 100 V by ca. 10 V. More specifically, when the blanking potential (i.e, the potential corresponding to the blanking signal level) at the terminal 69 becomes higher than 90 V, then the output of the peak detector circuit 65 becomes low, resulting in that the outputs of the level shift circuit 66 and the low-pass filter circuit 67 becomes low. Consequently, the output potential of the current-source circuit 68 becomes high, as a result of which the output potential of the cascode amplifier circuit 61 (the potential at the terminal 69) is lowered. In this way, the potential at the terminal 69 is prevented from becoming high. The effective bias stabilizing operation realized through cooperation of the circuits 65 to 68 can be understood from the above.

The emitter-grounded transistor constituting the final stage of each of the cascode amplifier circuits 61 and 62 has a transfer conductance $G_f$ of ca. 300 mS.

A high-frequency voltage gain ($E_0/E_i$) of the circuit shown in FIG. 11 can be determined in accordance with the following expressions (30):

$$\left.\begin{array}{l}\dfrac{-E_0}{E_i} = \dfrac{G_1 R_0}{1 + 1/G_l}, \; G_0 = \dfrac{1}{R_0}, \; G_1 = \dfrac{1}{R_1} \\[6pt] 1/G_l = (G_1 + Y_i)R_0 \dfrac{Y_0 + G_0}{Y_f - G_0} \\[6pt] |Y_f| \gg G_0, \; |Y_0| \gg G_0 \\[6pt] Y_i \approx j\omega C_i, \; C_i\text{: input capacitance} \\[6pt] Y_0 \approx j\omega C_0, \; C_0\text{: output capacitance} \\[6pt] Y_f \approx 300\text{ mS }(1 + j\omega/2\pi f_T) \\[6pt] \tau_1 \equiv C_i R_1 \\[6pt] \therefore 1/G_l \approx G_1 R_0 \dfrac{j\omega C_0(1 + j\omega/2\pi f_T)}{300\text{ mS}}(1 + j\omega\tau_1) \\[6pt] \text{Ex.} \\[6pt] G_1 = 1/330\Omega, \; R_0 = 10\text{ K}\Omega \\[6pt] C_0 = 16\text{ pF}, f_T = 300\text{ MHz} \\[6pt] C_i = 1\text{ pF}, \tau_1 = 0.33\text{ ns} \\[6pt] \dfrac{-E_0}{E_i} \approx \dfrac{30}{1 + \dfrac{jf}{100\text{ MHz}}(1 + jf/300\text{ MHz})(1 + jf/500\text{ MHz})}\end{array}\right\} \quad (30)$$

In the expressions (30), $R_0$ and $R_1$ represent the values of the resistors 70 and 71 mentioned previously, $C_j$ represents an input capacitor of the cascode amplifier circuit 61;62, $f_T$ represents a gain-bandwidth product of the current amplification factor of the base-grounded transistor constituting the final stage of the cascode amplifier circuit, and $C_0$ represents a total sum of the sum value (6 pF) of the output capacitors of the cascode amplifier circuits 61;62 and that of the electrode capacitor (10 Pf) of the CRT 30.

As will be understood from the implication or role of $C_0$ in the expressions (30), the filter 60 described hereinafter is presumed to be non-symmetrical. As can be seen from the right side of the last one of the expressions (30), the 3dB-bandwidth $f_c$ is calculated to be ca. 100 KHz. Further, amplitude of the output voltage can be determined to be ca. $75 V_{pp}$.

The stationary power consumption in the circuit according to the seventh embodiment shown in FIG. 11 is determined by an idle current of the cascode amplifier circuit. The idle current can be made to be about 23 mA, as described hereinafter in conjunction with another exemplary embodiment. In that case, the stationary power consumption is about 2.3 W ($=23$ mA$\times 100$ V), which is lower by a factor of about $\frac{1}{8}$ than the power consumption of 20 W derived from the expression (25) mentioned previously.

Next, let's consider a power consumption for the pumping on the presumption that $C_0$ is 16 pF as in the case of the above-mentioned example. Assuming that the frequency f is 100 MHz and that amplitude $E_{pp}$ of the output voltage is 75 $V_{pp}/\sqrt{2}$ the pumping power $W_p$ is about 8.5 W, as can be seen from the undermentioned expression (31).

$$W_p = V_{cc} E_{pp} C_0 f \qquad (31)$$
$$= 100 \text{ V} \cdot 75 V_{pp} \cdot 16 \text{ pF} \cdot 100 \text{ MHz} \cdot \frac{1}{\sqrt{2}}$$
$$= 8.5 \text{ W}$$

Referring again to FIG. 11, the filter circuit 60 shown therein is used for reducing the pumping power mentioned above.

Figure 12A:
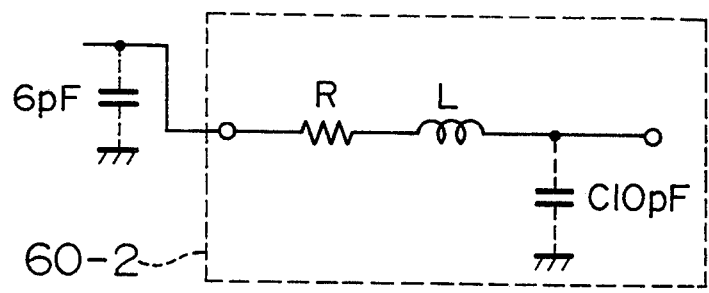
FIG. 12A, 12B and 12C are circuit diagrams showing concrete examples of implementation of a filter (60) constituting a part of the circuit shown in FIG. 11.
Figure 12B:
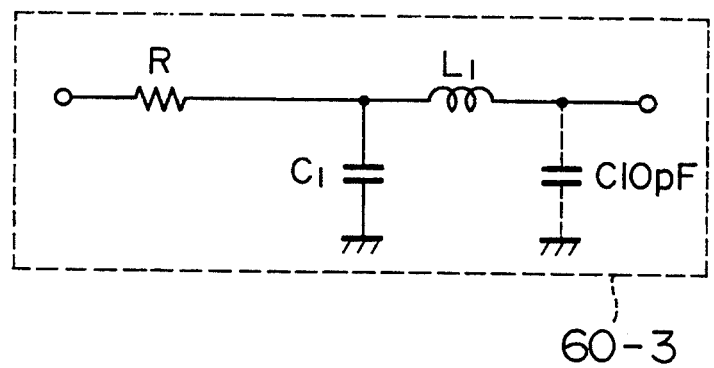
Figure 12C:
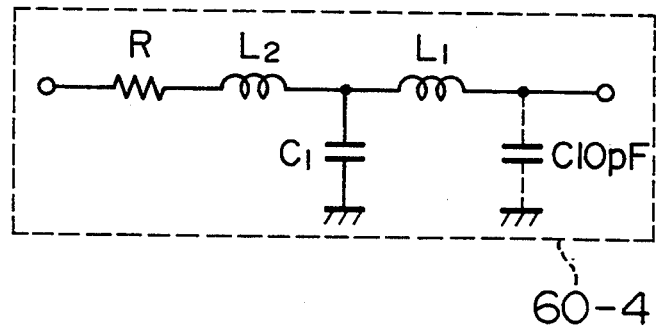

Typical circuit configurations of this filter 60 are shown in FIGS. 12A, 12B and 12C, by way of example. Reference numeral 60-2 in FIG. 12A denotes a filter of second order (i.e. whose order is equal to two), a numeral 60-3 in FIG. 12C denotes a third order, and a numeral 60-4 in FIG. 12C denotes a filter of fourth order. The undermentioned expressions (32), (33) and (34) represent amplitude flattening design formulae, respectively.

$$R = \frac{\sqrt{2}}{2\pi f_c C} \qquad (32)$$
$$L = \frac{1}{(2\pi f_c)^2 C}$$

$$R = \frac{1.5}{2\pi f_c C}, L_1 = \frac{1.33R}{2\pi f_c} \qquad (33)$$
$$C_1 = \frac{0.5}{2\pi f_c R}$$

$$R = \frac{1.5}{2\pi f_c C}, C_1 = \frac{1.1}{2\pi f_c R} \qquad (34)$$
$$L_1 = \frac{1.6R}{2\pi f_c}, L_2 = \frac{0.38R}{2\pi f_c}$$

In FIGS. 12A to 12C, the capacitor value C represents a stray capacitor value of the electrode terminal of the CRT, which value is assumed to be 10 pF in the computations mentioned above. The same assumption is adopted in the computations mentioned below. When the filter circuits shown in FIGS. 12A, 12B and 12C are designed by equating the 3 dB bandwidth $f_c$ to 100 MHz, the pumping powers $W_p$ in the case of 100 MHz$\times 75$ $W_{pp}/\sqrt{2}$ can be determined as follows:

$W_p \leq 7$ W in the case of the filter of 2nd order,
$W_p \leq 6.7$ W in the case of the filter of 3rd order and
$W_p \leq 6.7$ W in the case of the filter of 4th order.

As is apparent from the above, the pumping power can be reduced owing to the effect of the filter 60. Additionally, flash-over stress of the CRT can be absorbed owing to the effect of the resistor R constituting a part of the filter 60, whereby the active elements can effectively be protected against destruction.

Having described the filters 60 shown in FIGS. 12A to 12C, description will now be made of an eighth embodiment of the invention by referring to FIG. 13. The circuit configuration shown in FIG. 13 is of a first-grid drive system in contrast to the cathode drive scheme of the circuit shown in FIG. 11. Consequently, in the circuit shown in FIG. 13, the polarity of the video signal is reverse to that of the signal in the circuit shown in FIG. 11. To this end, the circuitries 65, 66, 67 and 68 which constitute the effective bias stabilization circuit are modified correspondingly more or less. However, since the principle underlying the effective bias stabilizing operation described hereinbefore applies equally to the eighth embodiment as well, repeated description thereof will be unnecessary. A reference numeral 72 in FIG. 13 denotes an idle current stabilizing circuit which may equally be applied to the circuits shown in FIGS. 12A to 12C.

Figure 14:
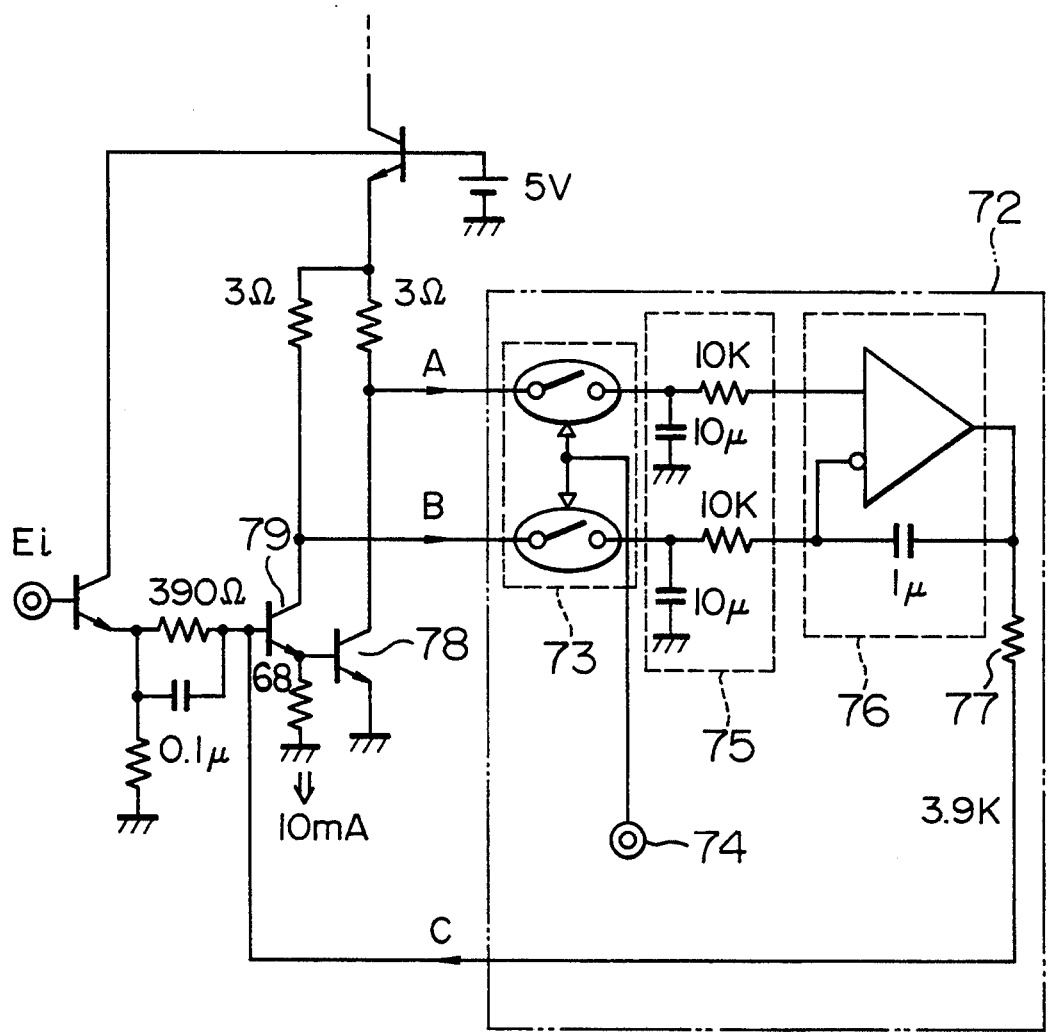
FIG. 14 is a circuit diagram showing an exemplary configuration of an idle current stabilizing circuit employed in the circuit shown in FIG. 13.

An exemplary circuit configuration of the idle current stabilizing circuit 72 is shown in FIG. 14. In this figure, reference numeral 73 denotes a pair of analogue switches, 74 denotes a blanking pulse input terminal of positive polarity, 75 denotes a pair of low-pass filters, 76 denotes an integrating circuit realized by combination of an operational amplifier and a capacitor, and a numeral 77 denotes a resistor. In operation, the analogue switches 73 are in the conducting (ON) state during a blanking period in which the blanking pulse makes appearance at the input terminal 74. In the blanking period, the idle current of the transistor 78 is compared with a collector current (ca. 10 mA) of the transistor 79. When this idle current is lower than 10 mA, potential at the terminal A is higher than that of the terminal B. Difference in potential between the terminals A and B is applied to the integrating circuit 76 via the low-pass filter circuit 75, resulting in that the output potential of the integrating circuit 76 is increased progressively. As a consequence, potential at the terminal C increases, which results in a corresponding increase in the idle current of the transistor 78. In this way, stabilization of the idle current of the transistor 78 can be achieved.

Figure 15:
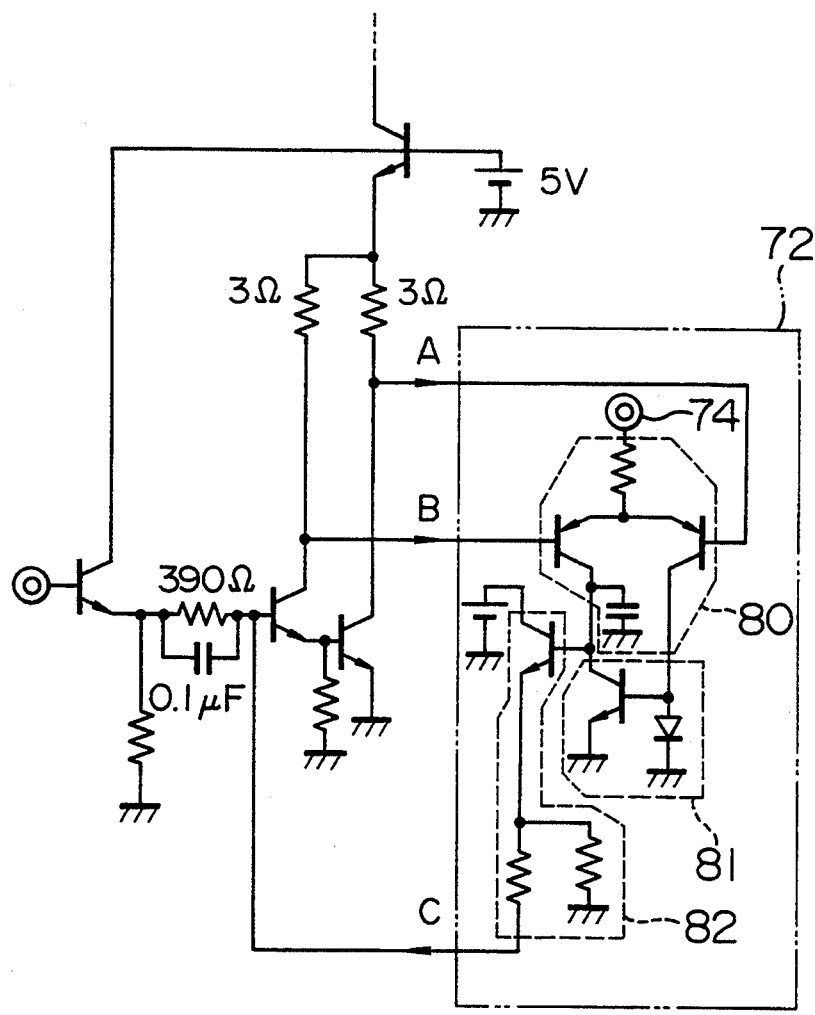
FIG. 15 is a circuit diagram showing another example of the idle current stabilizing circuit.

FIG. 15 shows another exemplary configuration of the idle current stabilizing circuit. In this figure, reference numeral 80 denotes a differential amplifier, 81 denotes a current mirror circuit and 82 denotes an emitter follower. The idle current stabilizing operation of the circuit shown in FIG. 15 will be self-explanatory in the light of the description made above by reference to FIG. 13.

One of the effects obtained with the idle current stabilizing circuit is seen in the reduction of dispersion or variance in the power consumption. Another effect of this circuit is to protect the cascode output amplifier against thermal runaway.

FIG. 16 shows a ninth embodiment of the invention which differs from the fifth embodiment shown in FIG. 8 in that a bias stabilizing circuit is additionally provided.

In FIG. 16, reference numeral 42 and 43 denote complementary current-source differential push-pull output circuits which are similar to those shown in FIG. 8, and a numeral 44 denotes a polarity inverting amplification circuit. The circuits connected downstream of the nodes 27; 27' are omitted from illustration. It is sufficient to mention that the output signal appearing at the node 27 is conducted to the cathode electrode of the CRT while the output signal at the node 27' is transmitted to a first grid electrode of the CRT.

In further reference to FIG. 16, a reference numeral 90 denotes a circuit for stabilizing the blanking voltage of the node 27 at a level of the source voltage minus 15 V, and a numeral 91 denotes a circuit for stabilizing the blanking voltage of the node 27' at a level of 15 V. Since operations of the blanking voltage stabilizing circuits 90 and 91 are similar to those of the circuits 65, 66 and 67 shown in FIGS. 11 and 13, description of the former will be unnecessary. Further, reference numeral 92 denotes a peak detection circuit for detecting the input blanking potential, and a numeral 93 denotes a voltage follower. Thus, it can be understood that the fixed bias terminal A of the differential pair of transistors constituting the cascode amplifier circuit 42 is automatically supplied with the blanking potential of the input signal. Accordingly, during the blanking signal period, the transistor shown at the right-hand side in the above-mentioned differential pair is turned off, while the transistor shown at the left-hand side is turned on. In this manner, manufacture-ascribable variance or dispersion in the DC bias of the input signal can be absorbed automatically.

A reference numeral 94 in FIG. 16 denotes a peak detection circuit similar to the circuit 92, and a numeral 95 denotes a voltage follower circuit similar to the voltage follower 93. These circuits 94 and 95 cooperate to supply automatically the blanking potential to the terminal B of the differential pair of transistors constituting the cascode amplifier circuit 43.

As can be appreciated from the above description, the circuits 92, 93, 94 and 95 serve for compensating for or absorbing automatically variance in the blanking potential of the input signal, while the circuits 90 and 91 serve for automatically absorbing variance in the blanking potential of the output signal. Thus, the use of a variable resistor or the like which would otherwise have to be provided for absorbing or accommodating the manufacture-ascribable variance is rendered unnecessary, which in turn means that the products as manufactured can be improved from the standpoint of service and maintenance.

Further, the instant embodiment is advantageous in that the power source circuit 47 shown in FIG. 8 can be spared, because variance of the complementary-type current source can automatically be compensated for owing to the presence of the output blanking voltage stabilizing circuits 90 and 91.

Figure 17:
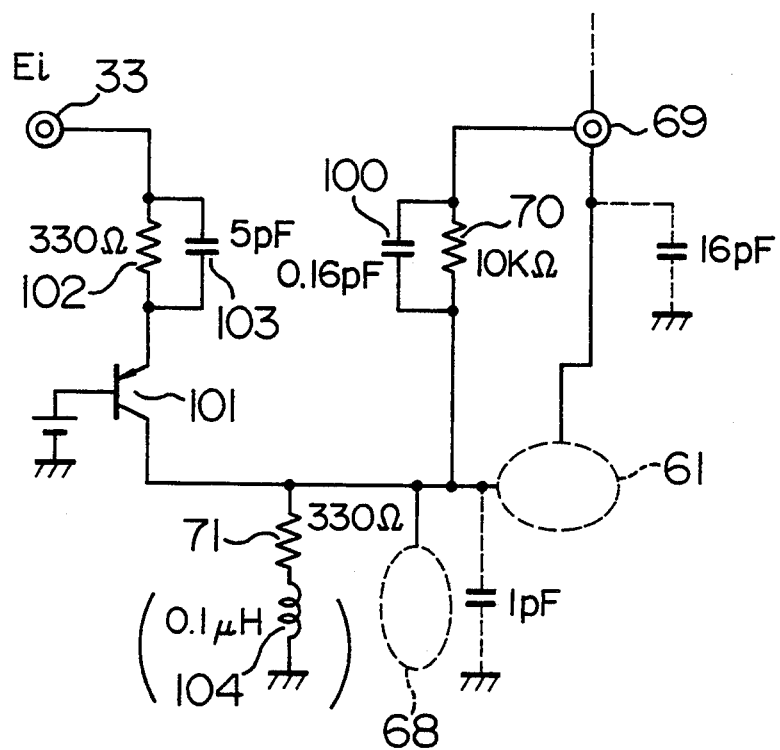
FIG. 17 is a circuit diagram showing a video output circuit according to a tenth embodiment of the invention.

FIG. 17 shows a tenth embodiment of the present invention which differs from the seventh embodiment described hereinbefore by reference to FIG. 11 in that the 3dB bandwidth (100 MHz) is increased to ca. 300 MHz through a phase leading compensation effect afforded by a negative feedback loop. In the following, the tenth embodiment will be described only in those respects which differ from those of the seventh embodiment (FIG. 11).

In FIG. 17, a reference numeral 100 denotes a phase leading compensation capacitor, 101 denotes a base-grounded transistor (current follower), 102 denotes an emitter resistor, and a numeral 103 denotes a peaking capacitor. Owing to the effect of the capacitor 100, phase of the loop gain (G1 appearing in the previously mentioned expression (30)) is caused to lead at a frequency higher than 100 MHz. By setting a product of values of the capacitor 103 and the resistor 102 (the time constant of the input peaking circuit) so as to be equal to the product of values of the capacitor 100 and the resistor 70 (the time constant of the feedback path), the frequency characteristic of the whole system can be maintained flat. The overall 3dB bandwidth can assume a value approximating to 300 MHz, i.e., the value of the gain-bandwidth product (ca. 300 MHz as indicated in the expression (30)) of the output transistor constituting the cascode amplifier circuit 61. In FIG. 17, a peaking coil 104 shown as enclosed in a parenthesis is effective for enhancing the 3dB bandwidth to a value higher than 300 MHz. More specifically, the peaking coil 104 is effective for reducing a phase lag brought about due to the stray capacitors at the nodes of the input side of the cascode amplifier circuit 61.

As will now be appreciated from the foregoing description, there can be provided a peaking circuit which has a value of the merit index M greater than 3 and which can thus enjoy an excellent efficiency in the sense mentioned hereinbefore. More specifically, according to the fourth, fifth and the seventh embodiments of the present invention, the video output circuit can be realized with an enhanced efficiency. In particular, according to the fifth embodiment of the invention, there can be provided a video output circuit which is suited advantageously for driving differentially the first grid and the cathode of the CRT display device. Further, according to the sixth embodiment, a preceding amplifier circuit enjoying an improved efficiency can be realized. With the eighth embodiment, reduction of variance or dispersion in the idle current as well as stabilization thereof can be achieved. With the seventh and eighth embodiments, the active elements can be protected against the flash-over stress of the CRT owing to the series resistor provided in the succeeding filter 60. According to the ninth embodiment, reduction of variation in the blanking potential as well as stabilization thereof can be achieved, whereby the source power can be utilized effectively, allowing the video output circuit to be implemented with a high efficiency.

We claim:

1. A wide bandwidth video output circuit with a low-pass filter whose order is equal to or greater than 4, the circuit comprising:
   a first terminal;
   a first inductor means connected with the first terminal;
   a first stray capacitor means present equivalently at a connection of the first terminal means and said first inductor means;
   a bridged T-type circuit including:
      first capacitor means,
      coil means connected in parallel to said first capacitor means and having a center tap, the parallel connected first capacitor and coil means being connected with the first inductor means such that the first inductor means is connected in series with the first terminal and said bridged T-type circuit, and third inductor means at least equivalently connected to said center tap of said coil means;

a second terminal connected to third inductor means such that the third inductor means is connected in series between the second terminal and the coil means center tap, one of the first and second terminals being supplied with a video signal and the other outputting a filtered video signal;

a second stray capacitance means present equivalently at a connection of the second terminal and said third inductor means;

a shunt circuit connected in series with said bridged T-type circuit the shunt circuit including;

second inductor means and first resistor means, the second inductor means and the first resistor means being connected in parallel with each other and in series with the parallel connected first capacitor and coil means of said bridged T-type circuit;

second resistor means connected in series to the parallel connected second inductor and first resistor means of said shunt circuit means;

a third stray capacitor means present equivalently in parallel to said second resistor means;

whereby said bridged T-type circuit means, said first inductor means, said shunt circuit means and said second resistor means constitute together with said first, second, and third stray capacitor means a low-pass filter whose order is equal to or more than 4.

2. The circuit according to claim 1, wherein said low-pass filter has a merit index of a value equal to or more than 3, the merit index representing a product of a value of said second resistor means, a 3dB-bandwidth for said low-pass filter, $2\pi$, and a sum of values of said first, second, and third stray capacitor means.

3. The circuit according to claim 1, further comprising:

a preceding frequency characteristic compensation circuit which includes cascode amplification means connected between the one of the first and second terminals which is supplied with the video signal and cable interfacing circuit means, said cable interfacing circuit means includes:

cable means;

first voltage follower means provided at an input side of said cable means;

second voltage follower means provided between said cable means and the cascode amplification means; and wherein a product of a one-way delay time of said cable means and an overall 3 dB frequency bandwidth has a value in a range from 0.125 to 0.5 inclusive thereof.

4. A video output circuit of a wide bandwidth, comprising:

complementary-type current-source differential push-pull output circuit means for driving differentially a first grid electrode of a cathode ray tube and a cathode electrode of said cathode ray tube, said complementary-type current-source differential push-pull output circuit means having first and second current-source output terminals;

a first output circuit having an input terminal connected with the first current-source output terminal and an output terminal connected with the first grid electrode of the cathode ray tube;

a second output circuit having an input terminal connected with the second current-source output terminal and an output terminal connected with the cathode electrode of the cathode ray tube;

each of said first and second output circuit means including:

a first terminal;

a first inductor means connected with the first terminal;

a first stray capacitor means present equivalently at a connection of the first terminal means and said first inductor means;

a bridged T-type circuit including;

first capacitor means, coil means connected in parallel to said first capacitor means and having a center tap, the parallel connected first capacitor and coil means being connected with the first inductor means such that the first inductor means is connected in series with the first terminal and said bridged T-type circuit, and third inductor means at least equivalently connected to said center tap of said coil means;

a second terminal connected to third inductor means such that the third inductor means is connected in series between the second terminal and the coil means center tap, one of the first and second terminals being connected to the input terminal and the other connected to the output terminal;

a second stray capacitance means present equivalently at a connection of the second terminal and said third inductor means;

a shunt circuit connected in series with the parallel connected first capacitor and coil means of said bridged T-type circuit, the shunt circuit including:

second inductor means and first resistor means, the second inductor means and the first resistor means being connected in parallel with each other;

second resistor means connected in series to the parallel connected second inductor and first resistor means of said shunt circuit means;

a third stray capacitor means present equivalently in parallel to said second resistor means.

5. A video output circuit of a wide bandwidth, comprising:

cascode output circuit means;

complementary voltage follower circuit means; and first circuit means connected between said cascode output circuit means and said complementary voltage follower circuit means, said first circuit means including:

a first terminal;

a first inductor means connected with the first terminal;

a first stray capacitor means present equivalently at a connection of the first terminal means and said first inductor means;

a bridged T-type circuit including;

first capacitor means, coil means connected in parallel to said first capacitor means and having a center tap, the parallel connected first capacitor and coil means being connected with the first inductor means such that the first inductor means is connected in series with the first terminal and said bridged T-type circuit, and third inductor means at least equivalently connected to said center tap of said coil means;

a second terminal connected to third inductor means such that the third inductor means is connected in series between the second terminal and the coil means center tap, one of the first and second terminals being connected to the cascode output circuit means and the other being connected to the complementary voltage follower circuit means;

a second stray capacitance means present equivalently at a connection of the second terminal and said third inductor means;

a shunt circuit connected in series with said bridged T-type circuit, the shunt circuit including;

second inductor means and first resistor means, the second inductor means and the first resistor means being connected in parallel with each other and being connected in series with the parallel connected first capacitor and coil means of said bridged-T-type circuit;

second resistor means connected in series to the parallel connected second inductor and first resistor means of said shunt circuit means;

a third stray capacitor means present equivalently in parallel to said second resistor means;

wherein said bridged T-type circuit means, said first inductor means, said shunt circuit means and said second resistor means constitute together with said first, second, and third stray capacitor means a low-pass filter whose order is equal to or more than 4.

6. A video output circuit for a cathode ray tube display according to claim 5, further comprising:

cable interfacing circuit means provided at the input side of said cascode output circuit means, said cable interfacing circuit means includes:

cable means;

first voltage follower means provided at the input side of said cable means;

second voltage follower means provided at the output side of said cable means; and wherein a product of a one-way delay time of said cable means and an overall 3 dB frequency bandwidth has a value in a range from 0.125 to 0.5 inclusive thereof.

7. An analog video output circuit for a cathode ray tube display, comprising:

complementary-type current-source differential push-pull output circuit for driving differentially a first grid electrode of a cathode ray tube and a cathode electrode of said cathode ray tube, said complementary-type current source differential push-pull output circuit includes:

differential amplifier means, including current-source circuit means for controlling a total current of said differential amplifier means, and complementary-type current-source push-pull output circuit means connected in a cascaded triode configuration to said differential amplifier means, an input video signal including an input blanking signal potential being applied to said differential amplifier means.

8. A video output circuit for a cathode ray tube display according to claim 6, wherein the differential amplifier means has first and second input terminals and further comprising:

input blanking signal potential stabilizing circuit means including:

detector means connected to the first input terminals of said differential amplifier means for detecting the input blanking signal potential; and control means connected to the second input terminals of said differential amplifier means for controlling an input bias voltage for said differential amplifier means.

9. A video output circuit for a cathode ray tube display according to claim 6, further comprising:

output blanking signal potential stabilizing circuit means including:

detector means connected to an output terminal of said push-pull output circuit amplifier means for detecting an output blanking signal potential; and control means connected to said current-source circuit of said differential amplifier means for controlling an output bias voltage.

* * * * *